(12) United States Patent
Choi

(10) Patent No.: US 10,446,253 B2
(45) Date of Patent: Oct. 15, 2019

(54) SEMICONDUCTOR MEMORY DEVICE AND REPAIR METHOD THEREOF

(71) Applicant: Samsung Electronics Co., Ltd., Suwon-si (KR)

(72) Inventor: Kyung-Rak Choi, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/127,712

(22) Filed: Sep. 11, 2018

(65) Prior Publication Data
US 2019/0237154 A1 Aug. 1, 2019

(30) Foreign Application Priority Data
Feb. 1, 2018 (KR) .................. 10-2018-0012900

(51) Int. Cl.
G11C 29/44 (2006.01)
G06F 11/10 (2006.01)
G11C 29/02 (2006.01)
G11C 29/42 (2006.01)

(52) U.S. Cl.
CPC .......... *G11C 29/44* (2013.01); *G06F 11/1048* (2013.01); *G11C 29/02* (2013.01); *G11C 29/42* (2013.01)

(58) Field of Classification Search
CPC .................................................. G06F 11/1048
See application file for complete search history.

(56) References Cited

U.S. PATENT DOCUMENTS

| | | | |
|---|---|---|---|
| 5,841,783 A | 11/1998 | Suzuki et al. | |
| 6,937,531 B2 * | 8/2005 | Frankowsky | G11C 29/44 365/189.05 |
| 6,967,878 B2 * | 11/2005 | Dono | G11C 29/785 365/185.09 |
| 7,890,820 B2 | 2/2011 | Peng | |
| 9,007,856 B2 | 4/2015 | Son et al. | |
| 9,564,247 B2 | 2/2017 | Shim | |
| 9,767,920 B2 | 9/2017 | Kim et al. | |
| 2008/0270854 A1 | 10/2008 | Kopel | |
| 2010/0332894 A1 | 12/2010 | Bowers et al. | |
| 2016/0155515 A1 | 6/2016 | Son et al. | |
| 2017/0139641 A1 | 5/2017 | Cha et al. | |
| 2017/0364407 A1 * | 12/2017 | Osada | G06F 11/3037 |
| 2018/0144813 A1 * | 5/2018 | Hong | G11C 16/04 |

* cited by examiner

Primary Examiner — Tan T. Nguyen
(74) Attorney, Agent, or Firm — Muir Patent Law, PLLC

(57) ABSTRACT

A repair method of a semiconductor memory device which includes a memory cell array including a main and a redundant cell array and error correction code (ECC) logic includes detecting a fail bit of each of a main repair unit of the main cell array and a redundant repair unit of the redundant cell array, determining whether the fail bit detected from each of the main and redundant repair units is correctable, by using the ECC logic and determining a first or a second correctable status, calculating a first cumulative correctable fail bit count of each of the main repair unit and the redundant repair unit, and determining whether to replace the main repair unit with the redundant repair unit depending on the first correctable status, the second correctable status, and the first and second cumulative correctable fail bit counts and performing a repair operation depending on the determination result.

20 Claims, 20 Drawing Sheets

FIG. 4A
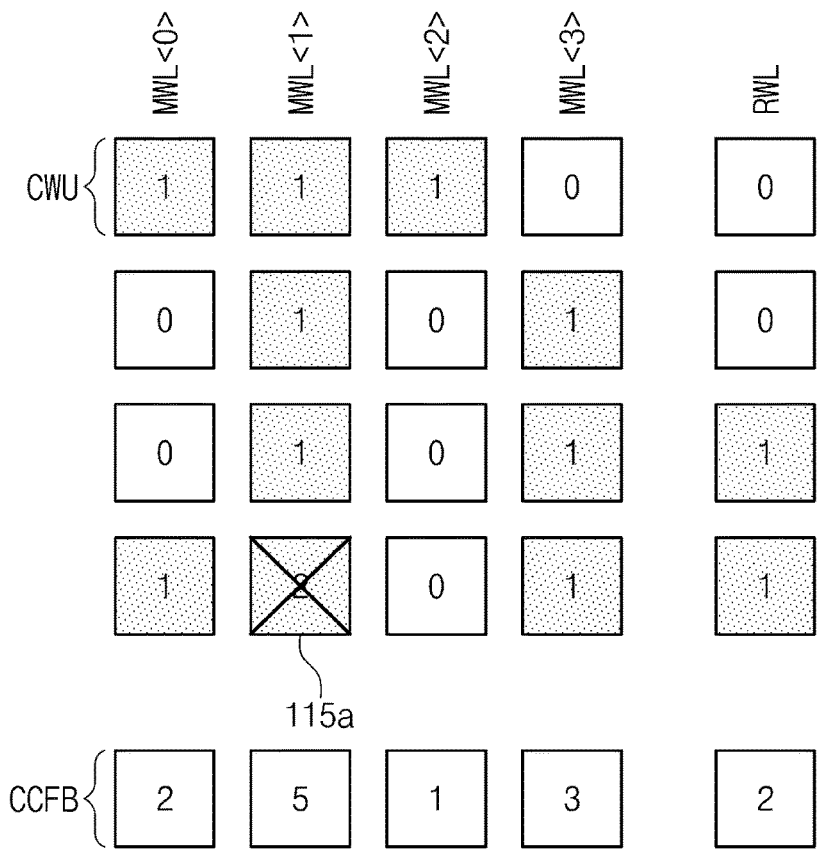
Sum of CCFB: 2+5+1+3=11
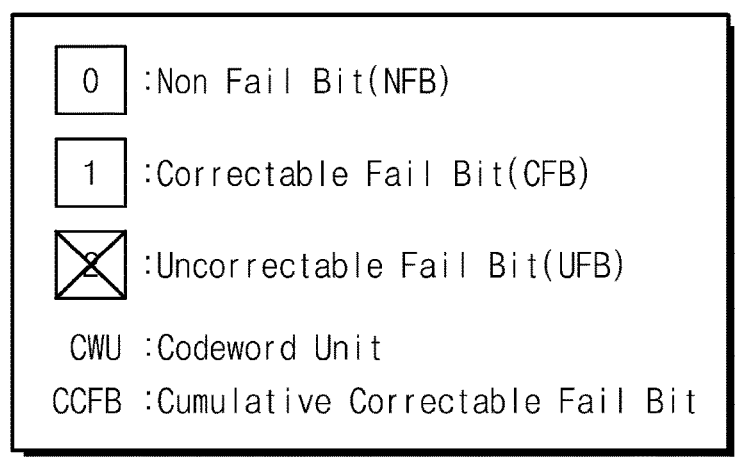

| ADDR | CCFB_M | FB Status |
|---|---|---|
| MRU<0> | 200 | UFB |
| MRU<1> | 30 | CFB |
| MRU<2> | 15 | CFB |
| MRU<3> | 40 | CFB |
| MRU<4> | 20 | CFB |
| MRU<5> | 10 | CFB |
| MRU<6> | 50 | CFB |
| MRU<7> | 0 | NFB |

135a

| ADDR | CCFB_R | FB Status |
|---|---|---|
| RRU<0> | 0 | NFB |
| RRU<1> | 20 | CFB |
| RRU<2> | 150 | UFB |
| RRU<3> | 40 | CFB |

| ADDR | CCFB_M | FB Status |
|---|---|---|
| MRU<0> | 200 | UFB |
| MRU<6> | 50 | CFB |
| MRU<3> | 40 | CFB |
| MRU<1> | 30 | CFB |

135b

| ADDR | CCFB_R | FB Status |
|---|---|---|
| RRU<0> | 0 | NFB |
| RRU<1> | 20 | CFB |

SEMICONDUCTOR MEMORY DEVICE AND REPAIR METHOD THEREOF

CROSS-REFERENCE TO RELATED APPLICATIONS

This application claims the benefit of priority under 35 U.S.C. § 119 to Korean Patent Application No. 10-2018-0012900, filed on Feb. 1, 2018, in the Korean Intellectual Property Office, the disclosures of which are incorporated by reference herein in their entireties.

BACKGROUND

1. Technical Field

Embodiments described herein relate to a semiconductor memory device, and more particularly, relate to a semiconductor memory device that may perform a repair operation based on an error correction code and a repair method thereof.

2. Description of the Related Art

The capacity and speed of semiconductor memory devices used in various electronic systems are increasingly dependent on a demand on high performance of users. In particular, a typical example of a volatile memory device may be a dynamic random access memory (DRAM). The DRAM stores data in the form of charges that are charged in a cell capacitor.

After manufacturing the DRAM, a technology for repairing a defective cell that occurs in a fabricating process is used. For example, there is used a redundancy repair technology for replacing a row or column including a defective memory cell with a normal row or column. The numbers of defective memory cells are sharply increasing due to the scale-down size of the semiconductor memory device. The size of a memory device increases as a redundancy for replacing defective cells is secured by using a conventional redundancy repair technique. In addition, a row or column redundancy circuit is configured to replace rows for each row group (e.g., two or four word lines) or columns for each column group (e.g., four or eight bit lines). Accordingly, a large amount of resources are unnecessarily consumed to repair a single bit failure.

In the disclosed embodiments, a repair technology associated with an error correction code may be provided to improve efficiency of the above-described redundancy repair technique using a more limited amount of resources.

SUMMARY

Example embodiments provide a semiconductor memory device that may implement high repair efficiency by using an error correction code while minimizing consumption of resources and a repair method thereof.

In some aspects, the disclosure is directed to a repair method of a semiconductor memory device which includes a memory cell array including a main cell array and a redundant cell array and error correction code (ECC) logic, the method comprising: detecting a fail bit of each of a main repair unit of the main cell array and a redundant repair unit of the redundant cell array; determining whether the fail bit detected from each of the main repair unit and the redundant repair unit is correctable to determine a first correctable status for the main repair unit or a second correctable status for the redundant repair unit, by using the ECC logic; calculating a first cumulative correctable fail bit count of the main repair unit and a second cumulative correctable fail bit count of the redundant repair unit; and determining whether to replace the main repair unit with the redundant repair unit depending on the first correctable status, the second correctable status, and the first and second cumulative correctable fail bit counts and performing a repair operation depending on a result of the determining.

In some aspects, the disclosure is directed to a semiconductor memory device comprising: a main cell array including a plurality of main repair units; a redundant cell array including a plurality of redundant repair units; error correction code logic configured to correct an error of data output from each of the main and redundant repair units; and a testability block configured to detect a fail bit of each of the plurality of main and the plurality of redundant repair units and to replace at least one main repair unit, in which a defect is present, with at least one redundant repair unit with reference to a number of the detected fail bits and a correction capacity of the error correction code logic.

In some aspects, the disclosure is directed to a semiconductor memory device comprising: a memory cell array including a plurality of main repair units and a plurality of redundant repair units; error correction code logic configured to perform an error detection and correction operation on data stored in the memory cell array; and a testability block configured to replace at least one main repair unit, in which a fail bit is present, with at least one redundant repair unit depending on a correction capability of the error correction code logic, wherein a fail bit count of the at least one main repair unit is greater than a fail bit count of the at least one redundant repair unit, and a fail bit of the at least one redundant repair unit is correctable by the error detection and correction operation.

BRIEF DESCRIPTION OF THE DRAWINGS

The above and other objects and features will become apparent by describing in detail exemplary embodiments thereof with reference to the accompanying drawings.

FIGS. 4A and 4B are views illustrating a repair method, according to example embodiments.

FIGS. 11A and 11B are views for describing a characteristic of a main cell register of FIG. 10.

FIGS. 13A and 13B are views for describing another characteristic of a main cell register of FIG. 10, according to example embodiments.

DETAILED DESCRIPTION

Figure 1:
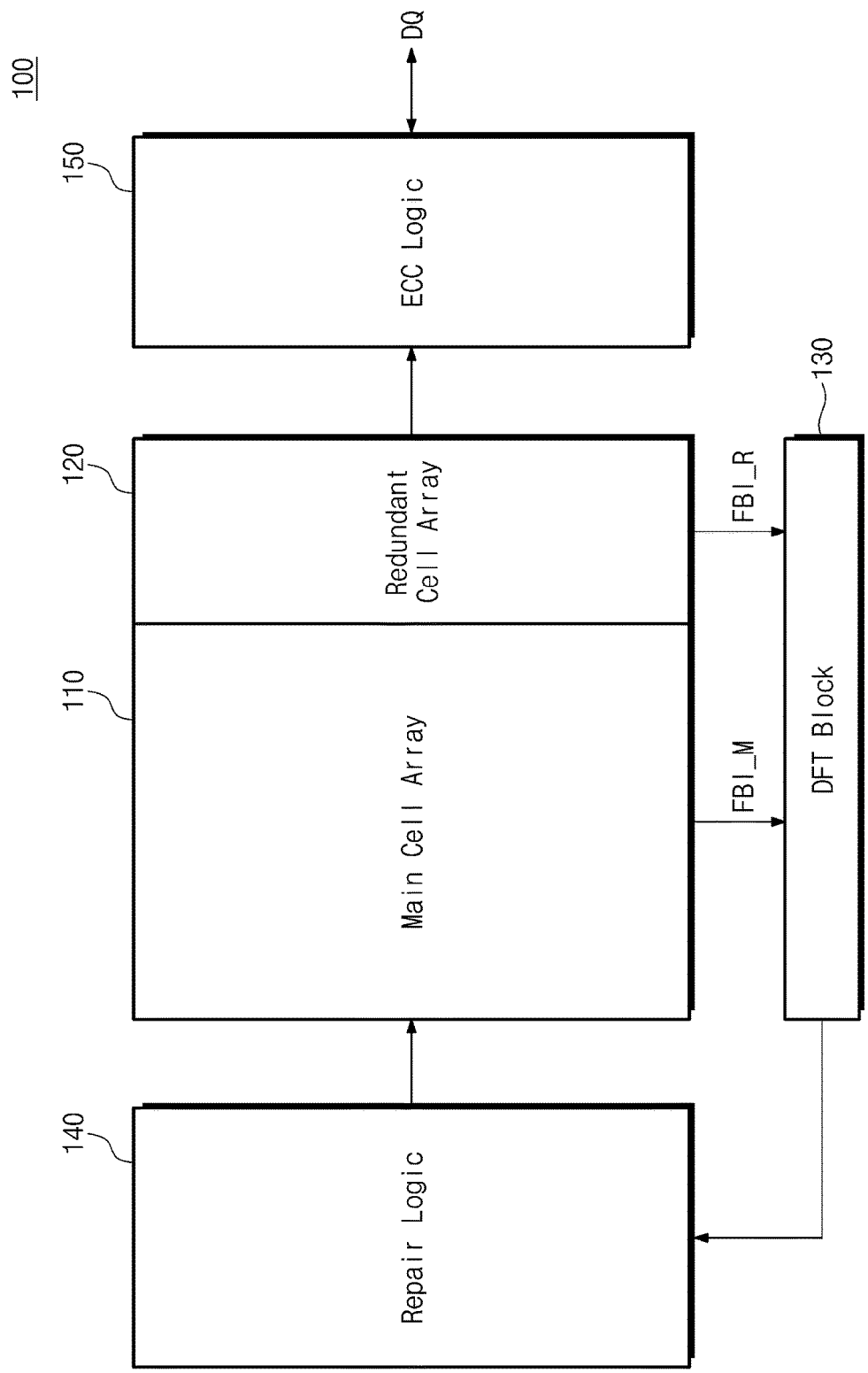
FIG. 1 is a block diagram illustrating a configuration of a semiconductor memory device, according to example embodiments.

It should be understood that both the foregoing general description and the following detailed description are provided as examples. Reference numerals will be represented in detail in the disclosed embodiments, examples of which are illustrated in the accompanying drawings. Wherever possible, the same reference numerals are used in the drawings and the description to refer to the same or similar parts.

Below, a synchronous DRAM (SDRAM) may be used as an example of a semiconductor device for describing features and functions of the inventive concepts. However, one skilled in the art may easily understand other merits and performance of the inventive concepts based on the contents disclosed here. The inventive concepts may be implemented or applied through other embodiments. In addition, the detailed description may be changed or modified according to view points and applications without departing from the claims, the scope and spirit, and any other purposes of the inventive concepts.

FIG. 1 is a block diagram illustrating a configuration of a semiconductor memory device, according to example embodiments. Referring to FIG. 1, a semiconductor memory device 100 may include a main cell array 110, a redundant cell array 120, a testability (hereinafter referred to as "Design For Test" or "DFT") block 130, repair logic 140, and error correction code (ECC) logic 150.

The main cell array 110 includes a plurality of memory cells that are connected with word lines and bit lines and are arranged in a row direction and a column direction. Each of the memory cells may include a cell capacitor and an access transistor. In each memory cell, a gate of the access transistor is connected to one of the word lines WL extending in the row direction. A first end of the access transistor is connected to a bit line (BL) or a complementary bit line (BLB) extending in the column direction. A second end of the access transistor is connected to the cell capacitor.

The redundant cell array 120 includes a plurality of redundant cells for replacing fail (or defective) cells of the main cell array 110. Configurations and operations of the redundant cells may be the same as those of the main cells. In a test operation, the main cell array 110 and the redundant cell array 120 are tested by the DFT block 130. Fail bit information FBI_M and FBI_R of the main cell array 110 and the redundant cell array 120, respectively, which corresponds to the test result, may be provided to the DFT block 130.

The DFT block 130 is a block for testing, and the DFT block 130 applies repairs based on a function of the ECC logic 150. The DFT block 130 performs a repair operation by using the fail bit information FBI_M of the main cell array 110 and the fail bit information FBI_R of the redundant cell array 120. The DFT block 130 may select repair units RUs, which may maximize the efficiency of repair, from the main cell array 110 and the redundant cell array 120, respectively. For example, the DFT block 130 may select one repair unit RU, in which a defect uncorrectable by the ECC logic 150 is present or which has a relatively large number of fail bits, in the main cell array 110. The DFT block 130 may select another repair unit RU, from which a fail bit is absent or which has a relatively small number of fail bits, in the redundant cell array 120. A policy to select a repair unit RU in each of the main cell array 110 and the redundant cell array 120 for repair will be more fully described with reference to accompanying drawings.

Based on a determination of the DFT block 130, the repair logic 140 may perform an operation of replacing a repair unit RU of the main cell array 110, in which a defect is present, with a repair unit RU of the redundant cell array 120, in which no defect is present. For example, the repair logic 140 may replace an address of a selected repair unit RU of the main cell array 110 with an address of a selected repair unit RU of the redundant cell array 120. For example, the repair logic 140 may be implemented with circuits that replace an address by using fuse logic, such as e-fuse or anti-fuse, or a read only memory (ROM).

The ECC logic 150 performs error correction encoding on data DQ input to the semiconductor memory device 100. For example, the ECC logic 150 performs error correction encoding on the data DQ input from the external device and stores the encoding result in the main cell array 110 or the redundant cell array 120 in units of codewords. Also, the ECC logic 150 performs error correction decoding on data output from the main cell array 110 or the redundant cell array 120. When an error is present in the read data read out of the main cell array 110 or the redundant cell array 120, the ECC logic 150 may output the read data after correcting the error.

The DFT block 130 may replace a repair unit RU of the main cell array 110, in which a defect is present, with a repair unit RU of the redundant cell array 120 based on an error correction capacity of the ECC logic 150. For example, the repair unit RU of the main cell array 110, which is uncorrectable by the ECC logic 150, may be replaced by the DFT block 130 with a repair unit RU of the redundant cell array 120, from which a defect is absent or in which a defect correctable by the ECC logic 150 is present. For example, since a defective cell is repaired with reference to an error correction capacity of the ECC logic 150, the semiconductor memory device 100 may be provided as a normal device.

Figure 2:
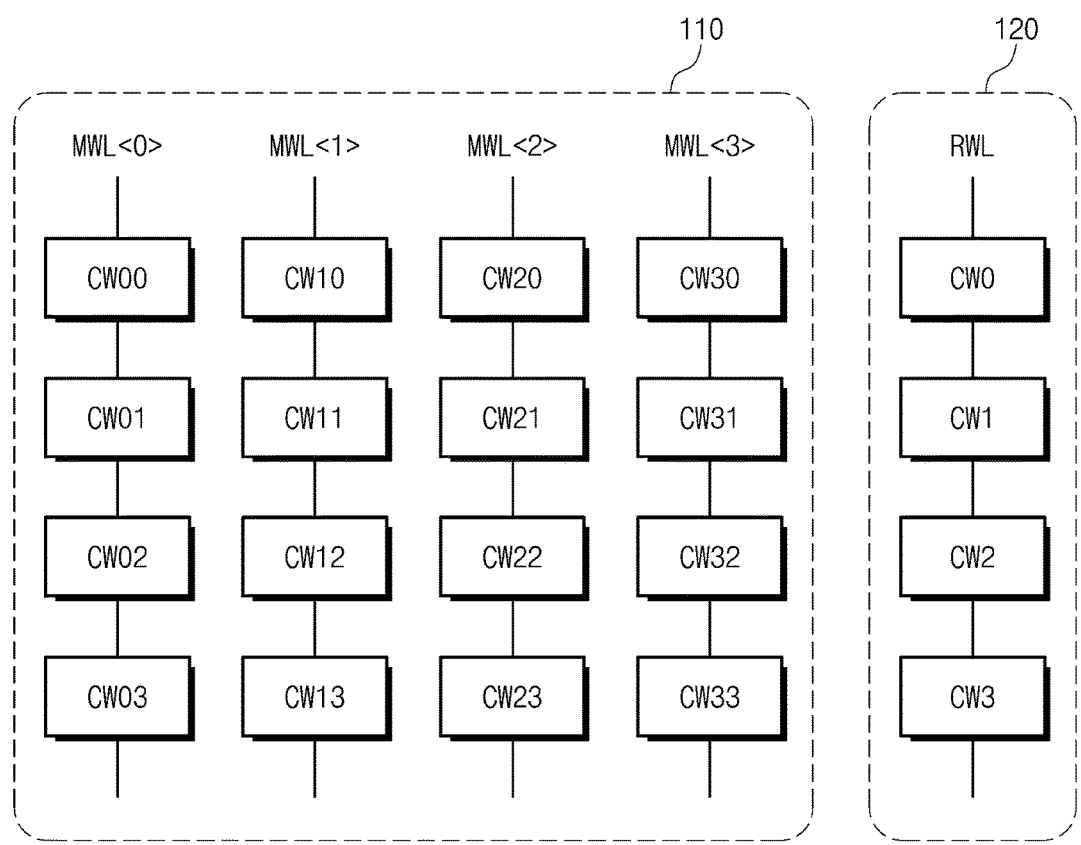
FIG. 2 is a block diagram illustrating a schematic structure of a cell array of FIG. 1, according to example embodiments.

FIG. 2 is a block diagram illustrating a schematic structure of a cell array of FIG. 1, according to certain example embodiments. Referring to FIG. 2, the main cell array 110 includes word lines MWL<0> to MWL<3> and the redundant cell array 120 includes word line RWL. Memory cells of codeword units CWij and CWj are connected to the word lines MWL<0> to MWL<3> and RWL. This will be in more detail described below.

Codeword units CWij (i and j each being an integer of 0 or more) connected to the plurality of word lines MWL<0> to MWL<3> are included in the main cell array 110. Each of the codeword units CWij is a group of memory cells corresponding to a codeword corresponding to an error correction code of the ECC logic 150. For example, the codeword unit CW00 includes a plurality of memory cells connected to the main word line MWL<0>. Bits respectively stored in the plurality of memory cells constitute one codeword for detecting and correcting an error by the ECC logic 150. As such, the plurality of codeword units CW01 to CW03 may be connected to the main word line MWL<0>. Likewise, codeword units CW1j, CW2j, and CW3j are connected to the main word lines MWL<1>, MWL<2>, and MWL<3>, respectively. Each of the main word lines MWL<0>, MWL<1>, MWL<2>, and MWL<3> is a repair unit RU, and a repair operation may be performed for an entire word line. For example, data stored in codeword units CW00 to CW03 connected to word line MWL<0> constitute one codeword for detecting and correcting an error of word line MWL<0>, data stored in codeword units CW10 to CW13 connected to word line MWL<1> constitute one codeword for detecting and correcting an error of word line MWL<1>, data stored in codeword units CW20 to CW23 connected to word line MWL<2> constitute one codeword for detecting and correcting an error of word line MWL<2>, and data stored in codeword units CW30 to CW33 connected to word line MWL<3> constitute one codeword for detecting and correcting an error of word line MWL<3>. The number of error bits or fail bits of data stored in each of the plurality of codeword units CWij may be detected by the DFT block 130.

A plurality of codeword units CW0, CW1, CW2, and CW3 are connected to the redundant word line RWL of the redundant cell array 120. The plurality of codeword units CWj are also connected to the redundant word line RWL in substantially the same manner as codeword units of the main cell array 110 are connected. Data stored in each of the plurality of codeword units CWj connected to the redundant word line RWL constitute one codeword for detecting and correcting an error by the ECC logic 150. The number of error bits or fail bits of data stored in each of the plurality of codeword units CWj may be detected by the DFT block 130.

The DFT block 130 detects whether the codeword units CWij of the main cell array 110 and the codeword units CWj of the redundant cell array 120 are defective, for a repair operation. The DFT block 130 may detect the number of fail bits included in each codeword unit through an error detection operation. Alternatively, the DFT block 130 may detect the number of fail bits of each codeword unit through a comparison operation using replica logic. For example, the DFT block 130 may detect the number of fail (or defective) bits by storing test data in codeword units and comparing data read from the codeword unit(s) with the test data. The DFT block 130 may add the numbers of fail bits detected from codeword units for each word line and may use a result of the addition as basic data for the repair operation.

The configurations of the main cell array 110 and the redundant cell array 120 are described above. However, it may be well understood that a way to replace a column may be used instead of the above-described way to replace a row.

Figure 3:
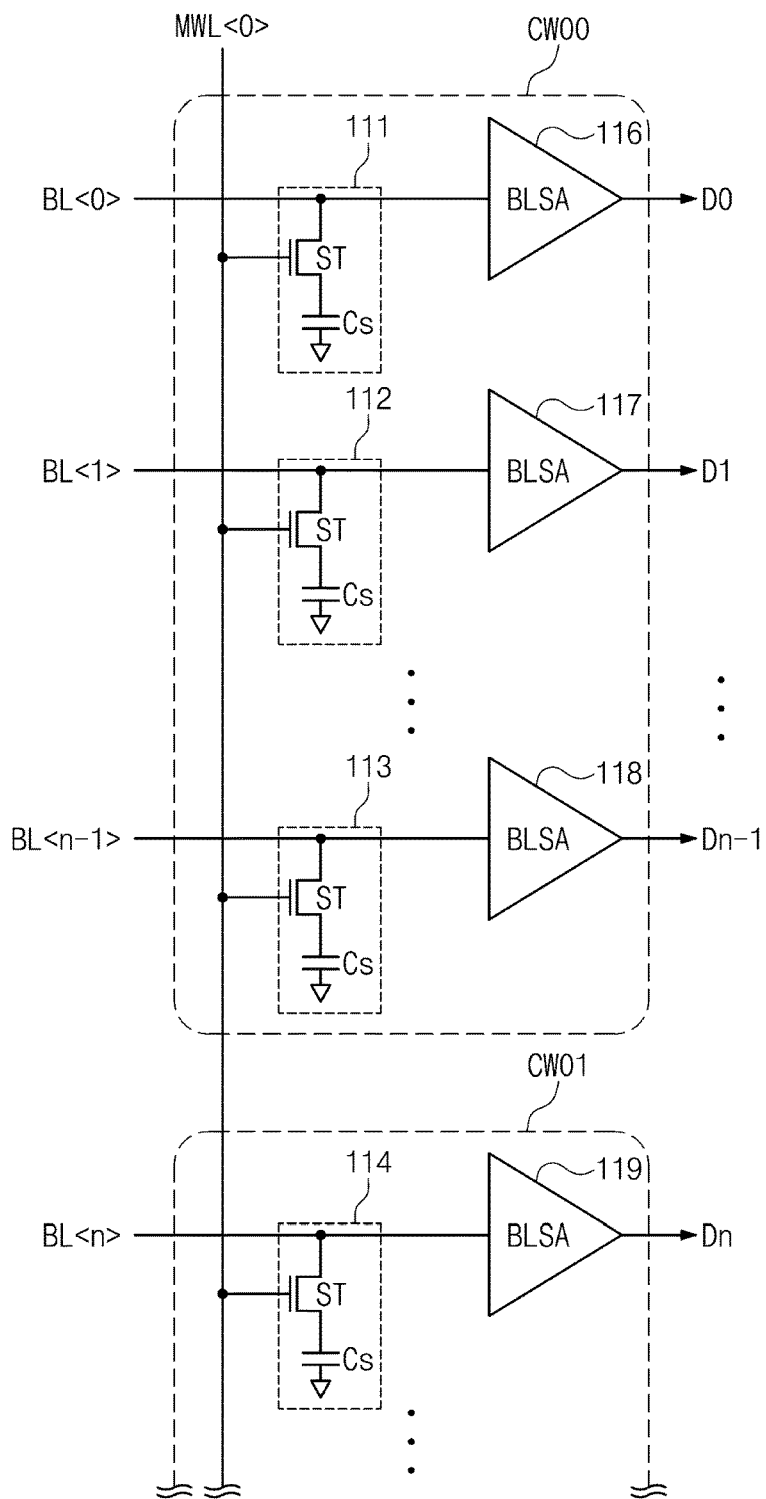
FIG. 3 is a circuit diagram illustrating an example codeword unit, according to example embodiments.

FIG. 3 is a circuit diagram illustrating a codeword unit, according to certain example embodiments. Referring to FIG. 3, the codeword unit CW00 connected to the main word line MWL<0> may include a plurality of memory cells and a plurality of bit line sense amplifiers.

The codeword unit CW00 includes a plurality of memory cells 111, 112, and 113 and bit line sense amplifiers 116, 117, and 118. The memory cell 111 is connected to the bit line sense amplifier 116 through a bit line BL<0>. The memory cell 111 may include an access transistor ST and a cell capacitor Cs. A gate of the access transistor ST is connected to the main word line MWL<0>, and a first end of the access transistor ST is connected to the bit line BL<0>. The cell capacitor Cs of the memory cell 111 is charged with charges, the amount of which corresponds to data being stored. The bit line sense amplifier 116 may sense and restore data stored in the memory cell 111 through the bit line BL<0>. Although not illustrated in FIG. 3, it may be well understood that the bit line sense amplifier 116 may be connected with memory cells in an open bit line structure. The bit line sense amplifier 116 may sense charges charge-shared through the bit line BL<0> and may output data D0. The memory cell 112 and the bit line sense amplifier 117 may be connected through the bit line BL<1> in the above-described manner, outputting data D1, and the memory cell 113 and the bit line sense amplifier 118 may be connected through the bit line BL<n−1> in the above-described manner, outputting data Dn−1. Likewise, the memory cell 114 of the codeword unit CW01 and the remaining bit line sense amplifier 119 may be connected through the bit line BL<n> in the same manner as the memory cell 111 and the bit line sense amplifier 116 are connected, outputting data Dn.

In the case where a defect is absent from the memory cells 111 to 113 or the bit line sense amplifiers 116 to 118, an error may not be detected from data D0 to Dn−1 read from the codeword unit CW00. In this case, the DFT block 130 determines that a fail bit does not exist. For example, the DFT block 130 may designate a status of the codeword unit CW00 as a non-fail bit NFB.

In contrast, a defect may exist in the memory cells 111 to 113 or the bit line sense amplifiers 116 to 118 included in the codeword unit CW00. In the case where data are read from the memory cells 111 to 113, an error may be included in the data bits D0 to Dn−1. However, when the error (or an error bit) of the read data bits D0 to Dn−1 is correctable by the ECC logic 150, the DFT block 130 marks a status of the codeword unit CW00 with a correctable fail bit CFB. The DFT block 130 stores the number of fail bits included in the codeword unit CW00. In addition, when the error (or an error bit) of the read data bits D0 to Dn−1 is uncorrectable by the ECC logic 150, the DFT block 130 marks a status of the codeword unit CW00 with an uncorrectable fail bit UFB.

The DFT block 130 performs the above-described operation of detecting the number of error bits or fail bits, with respect to all codeword units CWij and CWj of the main cell array 110 and the redundant cell array 120, respectively. The DFT block 130 determines a defect status of each of the codeword units CWij and CWj and stores the number of fail bits. Herein, an error bit that the DFT block 130 detects is referred to as a "fail bit".

Figure 4B:
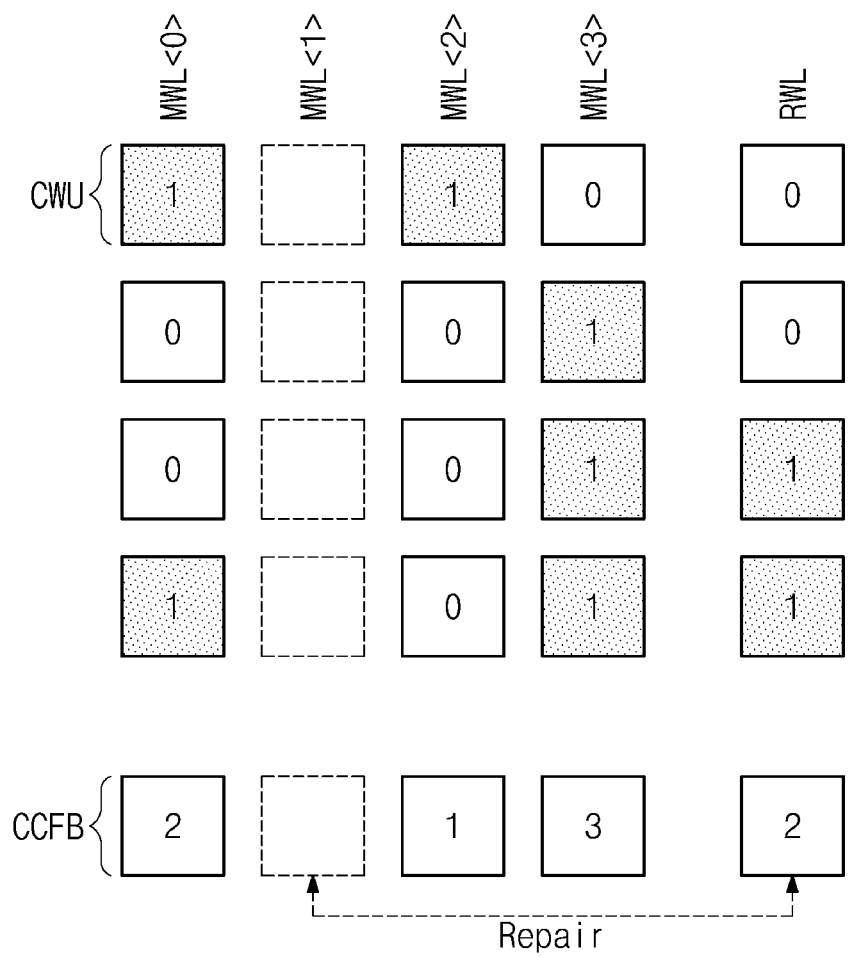

FIGS. 4A and 4B are views illustrating a repair method, according to example embodiments. FIG. 4A is a view illustrating a defect status of each of the main cell array 110 and the redundant cell array 120, which is detected by the DFT block 130, for each of codeword units CWij and CWj. Here, it is assumed that the ECC logic 150 corrects a 1-bit error for each codeword unit and only detects a 2-bit error without correction. For example, when the DFT block 130 detects a 2-bit error, the ECC logic 150 leaves such an error uncorrected. In an embodiment, each codeword unit may be set to a non-fail bit NFB status, in which a fail bit does not exist, a correctable fail bit CFB status, in which a correctable fail bit (i.e., a 1-bit error) exists, or an uncorrectable fail bit UFB status indicating an uncorrectable fail bit.

First, in the example of FIG. 4A, fail bit counts of codeword units connected to the main word line MWL<0> are detected as "1001" from the top to the bottom. Also, fail bit counts of codeword units connected to the main word line MWL<1> are detected as "1112" from the top to the bottom, fail bit counts of codeword units connected to the main word line MWL<2> are detected as "1000" from the top to the bottom, and fail bit counts of codeword units connected to the main word line MWL<3> are detected as "0111" from the top to the bottom. Fail bit counts of codeword units connected to the redundant word line RWL are detected as "0011" from the top to the bottom. Here, the DFT block 130 detects a codeword unit 115a corresponding to an uncorrectable fail bit UFB that is present in the main cell array 110.

The number of fail bits may be added together for each word line. For example, the number of cumulative correctable fail bits CCFB included in codeword units of the main word line MWL<0> is "2". In addition, the number of cumulative correctable fail bits CCFB included in codeword units of the main word line MWL<1> is "5". Likewise, the number of cumulative correctable fail bits CCFB included in codeword units of the main word line MWL<2> is "1", the number of cumulative correctable fail bits CCFB included in codeword units of the main word line MWL<3> is "3", and the number of cumulative correctable fail bits CCFB included in codeword units of the redundant word line RWL is "2". According to the above description, the total number of cumulative correctable fail bits obtained by adding the numbers of cumulative correctable fail bits CCFB of the main cell array 110 may be "11".

FIG. 4B is a view illustrating a repair method, according to example embodiments. Referring to FIG. 4B, any one of the main word lines MWL<0> to MWL<3>, which has an uncorrectable defect or has the greatest or maximum cumulative correctable fail bit count CCFB, may be replaced with the redundant word line RWL.

For example, the DFT block 130 may select one word line of the main word lines MWL<0> to MWL<3>, which has an uncorrectable defect or has the greatest (or maximum) cumulative correctable fail bit count CCFB. In an example illustrated in FIG. 4B, the codeword unit 115a (illustrated in FIG. 4A) having an error (i.e., fail bits) uncorrectable by the ECC logic 150 is included in the main word line MWL<1>. Memory cells of the main word line MWL<1> cannot be repaired through an error correction operation of the ECC logic 150. Accordingly, the defect of the main cell array 110 may be repaired by replacing only the main word line MWL<1> with the redundant word line RWL. Through the repair operation, the total number of cumulative fail bits obtained by adding the numbers of cumulative correctable fail bits CCFB of the main cell array 110 may be "8".

Figure 5A:
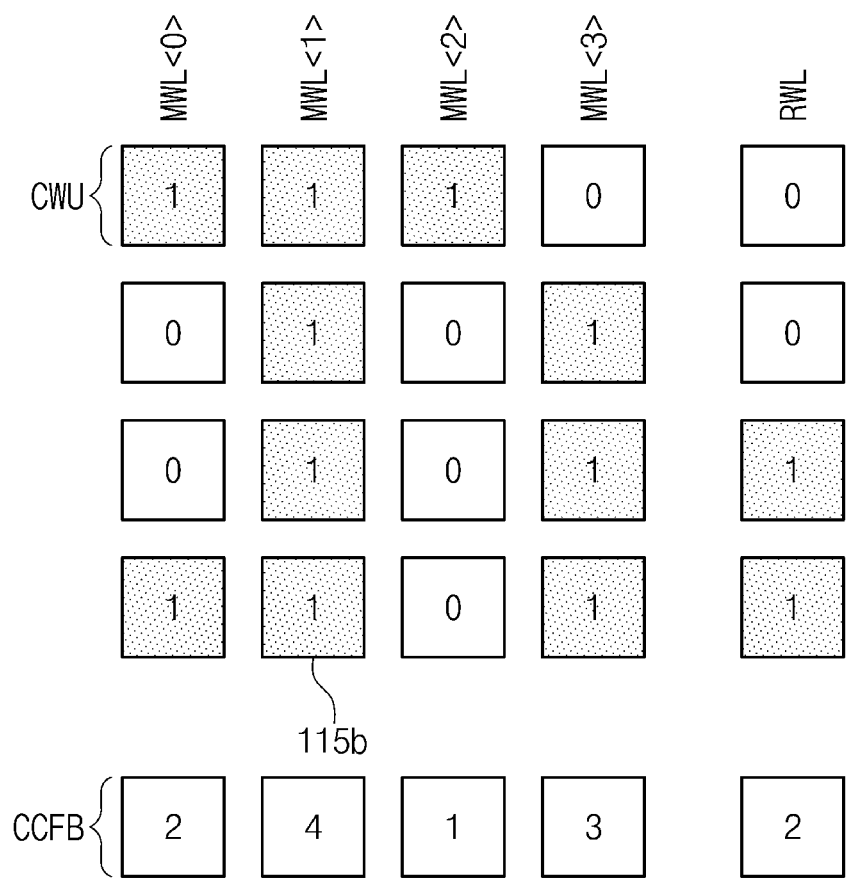
FIGS. 5A and 5B are views illustrating another example of a repair method, according to example embodiments.
Figure 5B:
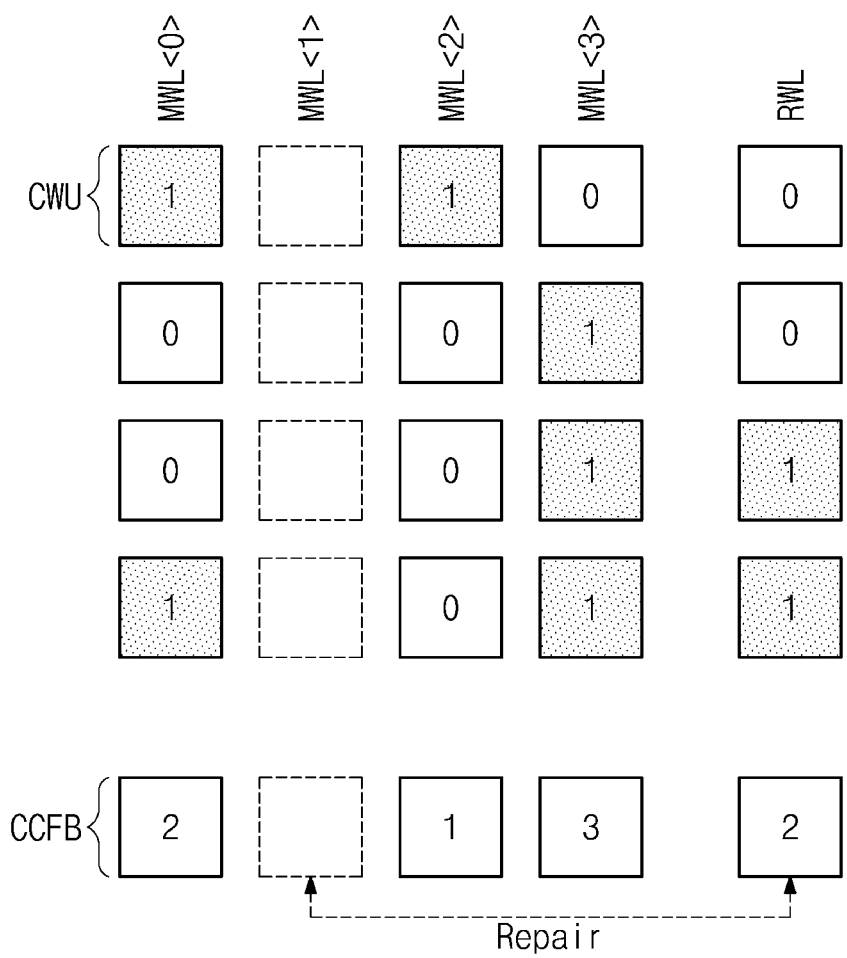

FIGS. 5A and 5B are views illustrating another example of a repair method, according to example embodiments. FIG. 5A is a view illustrating a defect status for each of codeword units CWij and CWj of each of the main cell array 110 and the redundant cell array 120, which is detected by the DFT block 130. Here, it is assumed that an error detection and correction capacity of the ECC logic 150 is the same as that described with reference to FIG. 4A.

In the example of FIG. 5A, fail bit counts of codeword units connected to the main word line MWL<0> are detected as "1001" from the top to the bottom, fail bit counts of codeword units connected to the main word line MWL<2> are detected as "1111" from the top to the bottom, fail bit counts of codeword units connected to the main word line MWL<2> are detected as "1000" from the top to the bottom, and fail bit counts of codeword units connected to the main word line MWL<3> are detected as "0111" from the top to the bottom. In addition, fail bit counts of codeword units connected to the redundant word line RWL are detected as "0011" from the top to the bottom. Unlike FIG. 4A, in the case of FIG. 5A, a codeword unit having an error (i.e., fail bits) uncorrectable by the ECC logic 150 may be absent from the main word line MWL<1>. For example, each of the codeword units of FIG. 5A may be correctable by the ECC logic 150. The reason is that a codeword unit 115b includes only a 1-bit error.

The numbers of fail bits of codeword units may be added together for each word line. As illustrated in FIG. 5A, the number of cumulative correctable fail bits CCFB included in codeword units of the main word line MWL<0> is "2". The number of cumulative correctable fail bits CCFB included in codeword units of the main word line MWL<1> is "4". Likewise, the number of cumulative correctable fail bits CCFB included in codeword units of the main word line MWL<2> is "1", the number of cumulative correctable fail bits CCFB included in codeword units of the main word line MWL<3> is "3", and the number of cumulative correctable fail bits CCFB included in codeword units of the redundant word line RWL is "2". According to the above description, the total number of cumulative fail bits obtained by adding the numbers of cumulative correctable fail bits CCFB of the main cell array 110 may be "10".

FIG. 5B is a view illustrating a repair method according to example embodiments under an error condition illustrated in FIG. 5A. Referring to FIG. 5B, any one of the main word lines MWL<0> to MWL<3>, which has the greatest or maximum cumulative correctable fail bit count CCFB, may be replaced with the redundant word line RWL.

For example, the DFT block 130 may select any one word line, which has the greatest (or maximum) cumulative correctable fail bit count CCFB, from among the main word lines MWL<0> to MWL<3>. In an example illustrated in FIG. 5B, the main word line MWL<1> has the greatest cumulative correctable fail bit count CCFB of "4". Accordingly, memory cells of the main word line MWL<1> may be repaired by the ECC logic 150. However, since the cumulative number of fail bits of the redundant word line RWL is 2, if the main word line MWL<1> is repaired with the redundant word line RWL, higher stability against a progressive defect that may occur later may be provided. Accordingly, if the main word line MWL<1> is replaced with the redundant word line RWL, the defect of the main cell array 110 may be repaired, and thus, the total number of fail bits corresponding to a sum of cumulative correctable fail bit counts CCFB of the main cell array 110 may be "8".

Figure 6:
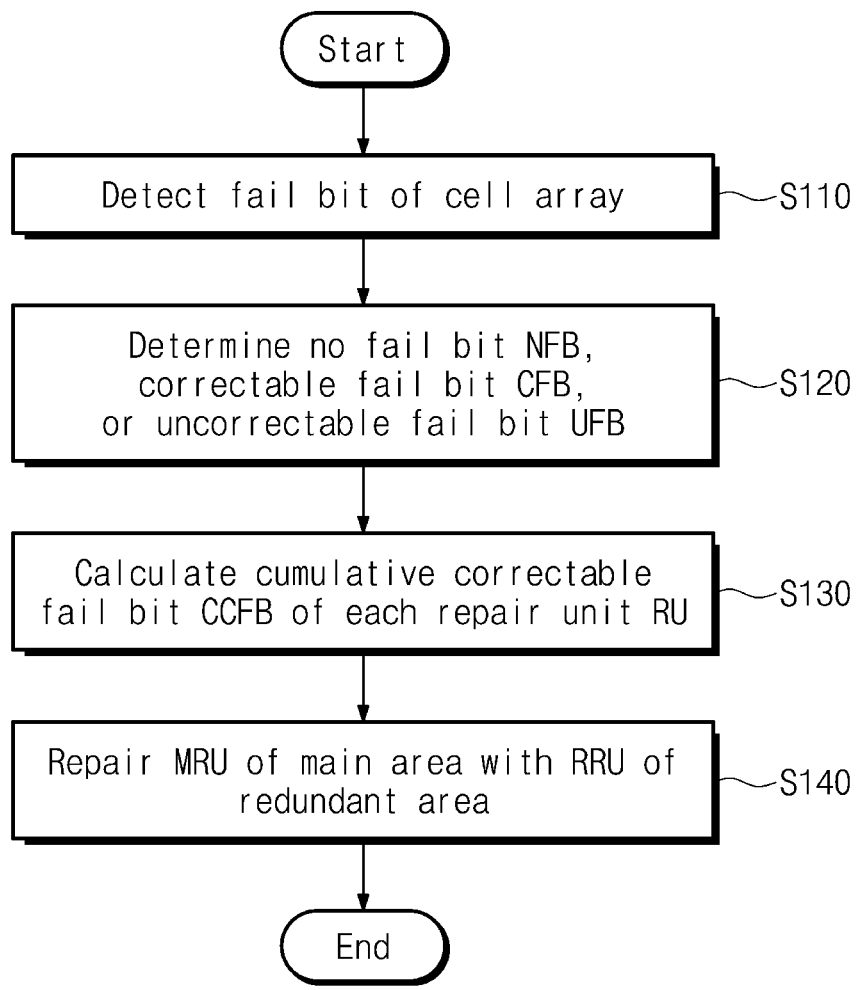
FIG. 6 is a flowchart illustrating a repair method of a semiconductor memory device, according to example embodiments.

FIG. 6 is a flowchart illustrating a repair method of a semiconductor memory device, according to example embodiments. Referring to FIG. 6, even though an error that is uncorrectable by using an error correction code occurs, the error may be corrected by using a correctable repair unit RRU of the redundant cell array 120.

In operation S110, the DFT block 130 detects fail bits of the main cell array 110 and the redundant cell array 120. For example, the DFT block 130 may write error correction encoded data in the main cell array 110 and the redundant cell array 120 and may perform an error detection operation on read data to detect whether a fail bit exists and the number of fail bits. Alternatively, the DFT block 130 may detect the number of fail bits for each codeword unit in a way to write data in the main cell array 110 and the redundant cell array 120 and to compare read data with the written data.

In operation S120, the DFT block 130 may determine a fail bit status no fail bit NFB, correctable fail bit CFB, or uncorrectable fail bit UFB of each codeword unit based on the number of fail bits detected. For example, the DFT block 130 may determine the fail bit status NFB, CFB, or UFB of each codeword unit depending on the error detection and correction capacity of the ECC logic 150. It is assumed that the ECC logic 150 may correct a 1-bit error included in a codeword and may only detect an error of two or more bits. Under this assumption, the DFT block 130 may determine a codeword unit including a 1-bit error as a correctable fail bit CFB error and may determine a codeword unit including an error of two or more as an uncorrectable fail bit UFB error.

In operation S130, the DFT block 130 calculates the number of cumulative correctable fail bits CCFB for each repair unit RU of the main cell array 110 and the redundant cell array 120 based on the number of fail bits detected and a fail bit status NFB, CFB, or UFB of each codeword unit. For example, the DFT block 130 calculates the number of cumulative correctable fail bits CCFB of each of the main word lines MWL<0> to MWL<3> and the redundant word line RWL. In this case, the DFT block 130 may also calculate the number of cumulative correctable fail bits CCFB with regard to a repair unit including an uncorrectable fail bit UFB error. A fail bit status of a repair unit including the uncorrectable fail bit UFB error may be designated as an uncorrectable fail bit UFB status. Alternatively, in any embodiment, only the number of correctable fail bits may be included in the number of cumulative correctable fail bits CCFB.

In operation S140, the DFT block 130 performs a repair operation with reference to the number of cumulative correctable fail bits CCFB of each main repair unit MRU included in the main cell array 110 and each redundant repair unit RRU in the redundant cell array 120. First, the DFT block 130 determines whether a redundant repair unit RRU of the redundant cell array 120 is correctable by the ECC logic 150. In the case where the redundant repair unit RRU of the redundant cell array 120 is uncorrectable by the ECC logic 150, there is no need to apply a repair scheme, according to example embodiments. However, in the case where the redundant repair unit RRU of the redundant cell array 120 is correctable by the ECC logic 150, an uncorrectable main repair unit MRU of the main cell array 110 or a correctable main repair unit MRU of the main cell array 110, which has the greatest cumulative correctable fail bit count CCFB, may be repaired. A method of performing a repair operation based on the number of cumulative correctable fail bits CCFB will be described in detail with reference to FIG. 7.

Figure 7:
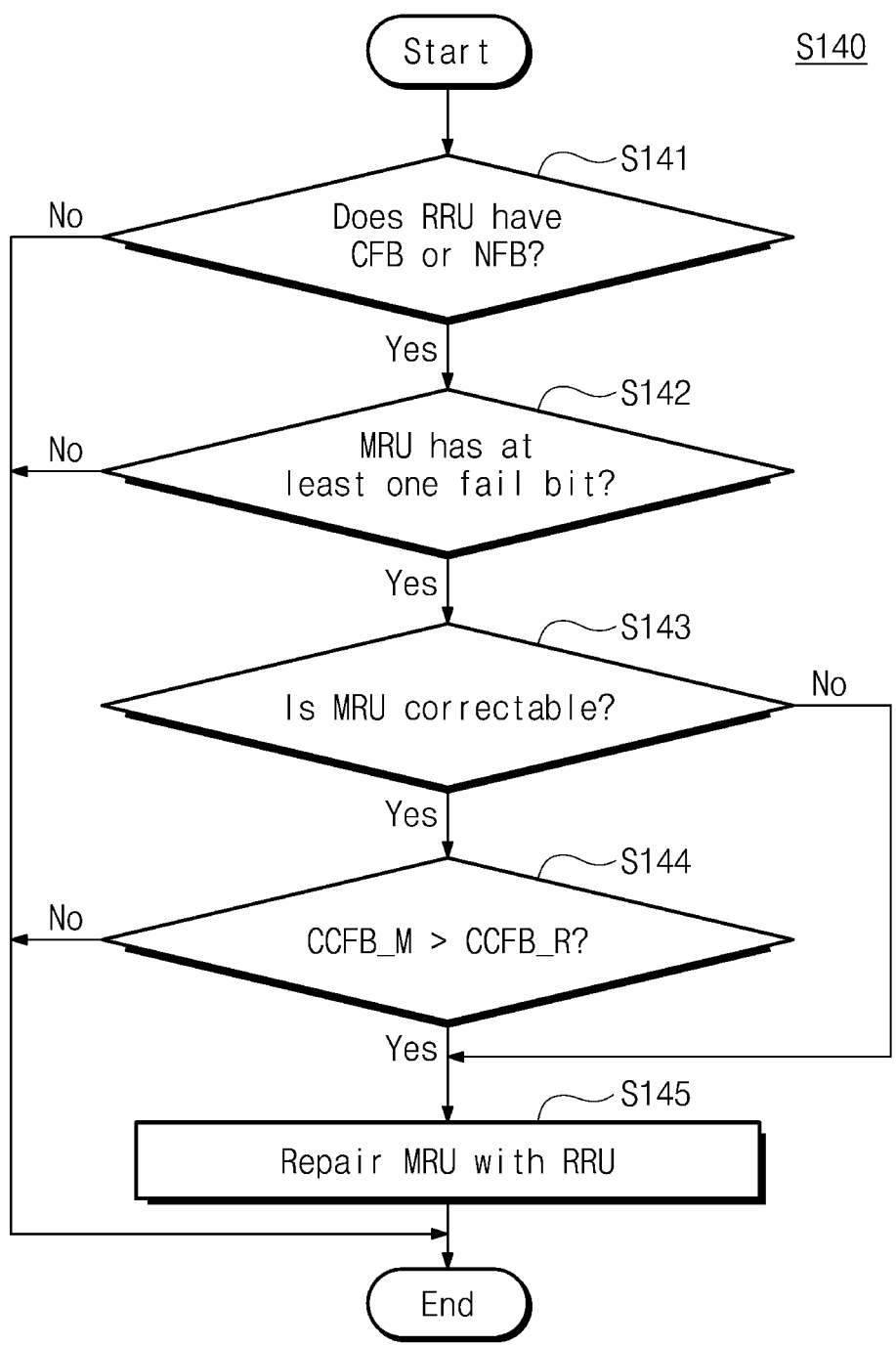
FIG. 7 is a flowchart illustrating operation S140 of FIG. 6, according to example embodiments.

FIG. 7 is a flowchart illustrating operation S140 of FIG. 6. Referring to FIG. 7, the DFT block 130 may repair a main repair unit MRU of the main cell array 110 based on the number of cumulative correctable fail bits CCFB for each main repair unit MRU. A repair procedure using one repair unit of the redundant cell array 120 will be described with reference to FIG. 7. A method of performing a repair operation by using the redundant cell array 120 including at least two or more redundant repair units RRU will be described with reference to FIG. 8.

In operation S141, the DFT block 130 checks whether a redundant repair unit RRU of the redundant cell array 120 includes a correctable fail bit CFB or a non-fail bit NFB. For example, the DFT block 130 may determine whether an uncorrectable fail bit UFB error, which is uncorrectable by the ECC logic 150, is included in a redundant repair unit RRU. In the case where a fail bit status of a redundant repair unit RRU indicates a correctable fail bit CFB status or a non-fail bit NFB status (S141, Yes), the procedure proceeds to operation S142. In contrast, in the case where the fail bit status of a redundant repair unit RRU indicates an uncorrectable fail bit UFB status (S141, No), the method of performing repairing by using the redundant repair unit RRU ends.

In operation S142, the DFT block 130 checks the fail bit status of the main repair unit MRU of the main cell array 110. In the case where a main repair unit MRU of the main cell array 110 does not include a fail bit (S142, No), the method ends because there is no need to perform a repair operation. In the case where a main repair unit MRU includes at least one fail bit (S142, Yes), the procedure proceeds to operation S143.

In operation S143, the DFT block 130 selects any one of the main repair units MRU that includes a fail bit. In particular, the DFT block 130 may preferentially select a main repair unit MRU having the uncorrectable fail bit UFB status. In the case where a main repair unit MRU does not have the uncorrectable fail bit UFB status, the DFT block 130 may select a main repair unit MRU having the greatest cumulative correctable fail bit count CCFB. In the case where the main repair unit MRU selected by the DFT block 130 is correctable by the ECC logic 150 (S143, Yes), the procedure proceeds to operation S144. In contrast, in the case where the main repair unit MRU selected by the DFT block 130 is uncorrectable by the ECC logic 150 (S143, No), the procedure proceeds to operation S145.

In operation S144, the DFT block 130 compares a cumulative correctable fail bit count CCFB_M of the selected main repair unit MRU and a cumulative correctable fail bit count CCFB_R of the redundant repair unit RRU. In the case where the cumulative correctable fail bit count CCFB_M of the selected main repair unit MRU is not greater than the cumulative correctable fail bit count CCFB_R of the redundant repair unit RRU (S144, No), the repair method ends. In the case where the cumulative correctable fail bit count CCFB_M of the selected main repair unit MRU is greater than the cumulative correctable fail bit count CCFB_R of the redundant repair unit RRU (S144, Yes), the procedure proceeds to operation S145.

In operation S145, the DFT block 130 repairs the selected main repair unit MRU with the redundant repair unit RRU. For example, the DFT block 130 may set (or fuse-program) the repair logic 140 such that an address of the main repair unit MRU is changed to direct the redundant repair unit RRU.

A method of repairing a main repair unit MRU of the main cell array 110 by using one redundant repair unit RRU of the redundant cell array 120 is briefly described above. According to an example embodiment, even though a defect is present in a redundant repair unit RRU, the redundant repair unit RRU may be used for repairing a main repair unit MRU of the main cell array 110. In addition, even though a main repair unit MRU that may not be repaired by the ECC logic 150 is present in main repair units MRU, the main repair unit MRU may be repaired by using a redundant repair unit RRU.

Figure 8:
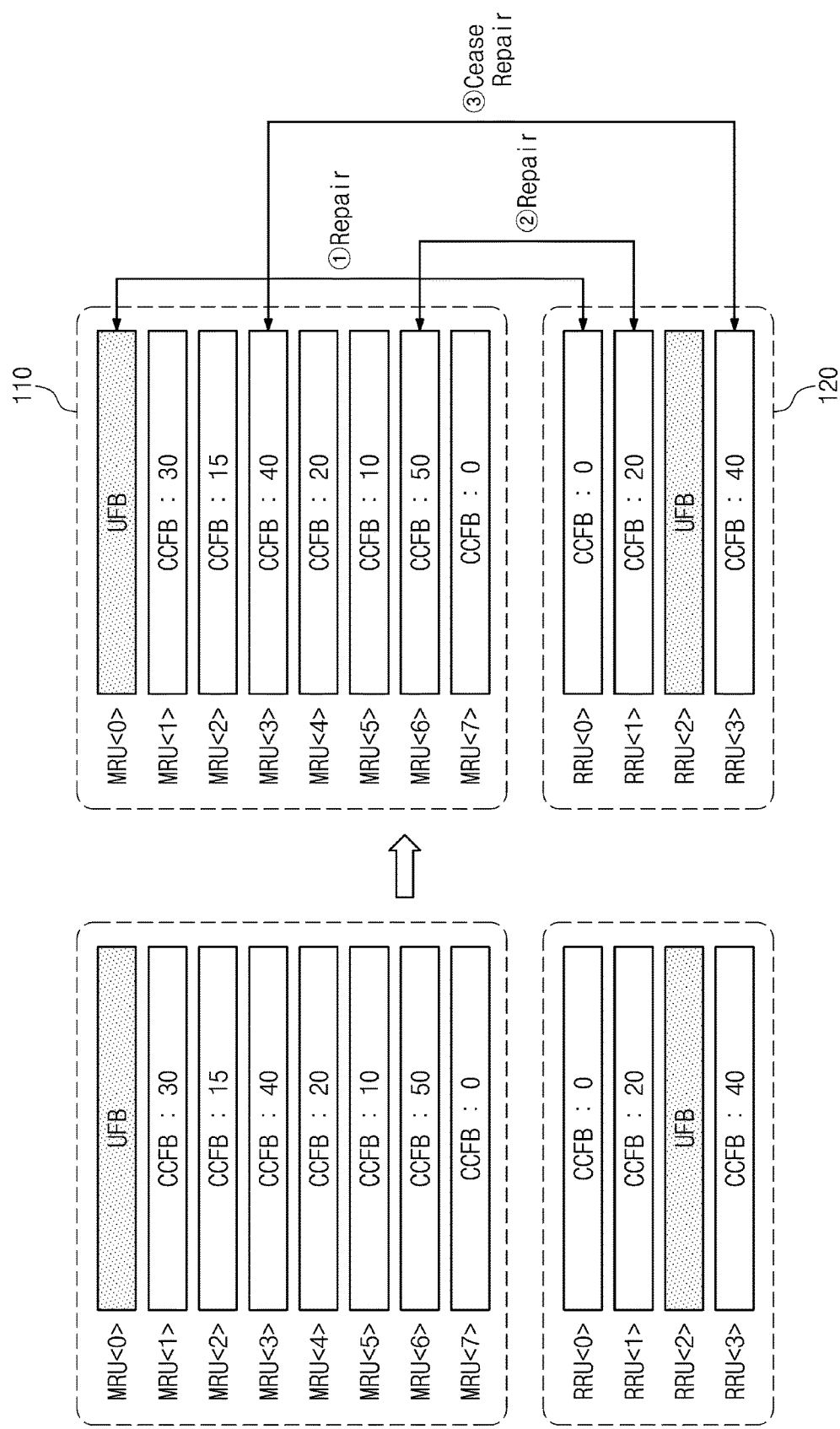
FIG. 8 is a view illustrating another example embodiment.

FIG. 8 is a view illustrating another example embodiment. Referring to FIG. 8, a policy may be provided to perform a repair operation based on a cumulative correctable fail bit count CCFB in the case of the redundant cell array 120 including a plurality of redundant repair units RRUs.

It is assumed that eight main repair units MRU<0> to MRU<7> are included in the main cell array 110. A main repair unit MRU<0> having an uncorrectable fail bit error UFB, which is uncorrectable by the ECC logic 150, may be included in the main cell array 110. In addition, main repair units MRU<1> to MRU<6>, each having a correctable fail bit errors CFB correctable by the ECC logic 150, and a main repair unit MRU<7>, from which a fail bit is absent (e.g., CCFB=0), may be included in the main cell array 110. The counts of cumulative correctable fail bit CCFB of the main repair units MRU<1> to MRU<7> have the values illustrated in FIG. 8.

In addition, it is assumed that four redundant repair units RRU<0> to RRU<3> are included in the redundant cell array 120. A redundant repair unit RRU<2> having an uncorrectable fail bit error UFB uncorrectable by the ECC logic 150 may be included in the redundant cell array 120. Redundant repair units RRU<1> and RRU<3>, each having a correctable fail bit error CFB correctable by the ECC logic 150, and a redundant repair unit RRU<0>, from which a fail bit is absent (e.g., CCFB=0), may be included in the redundant cell array 120. It is assumed that the counts of cumulative correctable fail bit CCFB of the redundant repair units RRU<0> to RRU<3> have the values illustrated in FIG. 8.

Based on the fail bit status of the main cell array 110 and the redundant cell array 120, the main repair unit MRU<0> having an uncorrectable fail bit UFB status among the main repair units MRU<0> to MRU<7> is preferentially selected for repair. The redundant repair unit RRU<0> having a non-fail bit status NFB (e.g., CCFB=0) is selected from the redundant repair units RRU<0> to RRU<3>. The selected main repair unit MRU<0> is replaced with the selected redundant repair unit RRU<0>. This process is marked by an identification number ① indicating a repair priority. In the case where a main repair unit MRU having the uncorrectable fail bit UFB status is further present in the main repair units MRU<0> to MRU<7>, the main repair unit MRU having the uncorrectable fail bit UFB status may be repaired by using the redundant repair unit RRU<1>. Except for the redundant repair unit RRU<0> used for repair, the redundant repair unit RRU<1> may be a redundant repair unit RRU having the smallest cumulative correctable fail bit count CCFB among the redundant repair units RRU<0> to RRU<3>.

After repairing the main repair unit MRU<0>, any one of the remaining main repair units MRUs may be selected to perform a next repair operation. In particular, any one main repair unit MRU having the greatest cumulative correctable fail bit count CCFB among the main repair units MRU<1> to MRU<7> is selected. For example, the main repair unit MRU<6> having a cumulative correctable fail bit count CCFB of "50" is selected. The redundant repair unit RRU<1> having the smallest cumulative correctable fail bit count CCFB is selected from the redundant repair units RRU<1>, and RRU<3>. The selected main repair unit MRU<6> is replaced with the selected redundant repair unit RRU<1>. This process is marked by an identification number ② indicating a repair priority.

After repairing the main repair unit MRU<6>, any one of the main repair units MRU<1> to MRU<5> and MRU<7> is selected to perform a next repair operation. Any one main repair unit having the greatest cumulative correctable fail bit count CCFB among the remaining main repair units MRU<1> to MRU<5> and MRU<7> may be selected. For example, the main repair unit MRU<3> having a cumulative correctable fail bit count CCFB of "40" is selected. The redundant repair unit RRU<3> having the smallest cumulative correctable fail bit count CCFB is selected from the redundant repair units RRU<2> and RRU<3>. However, a cumulative correctable fail bit count CCFB of the selected main repair unit MRU<3> and a cumulative correctable fail bit count CCFB of the selected redundant repair unit RRU<3> are identical to each other, that is, "40". Accordingly, even though a repair operation is performed, there is no advantage. In this case, the DFT block 130 may terminate a repair operation. This process is marked by an identification number ③ indicating a repair sequence.

Figure 9:
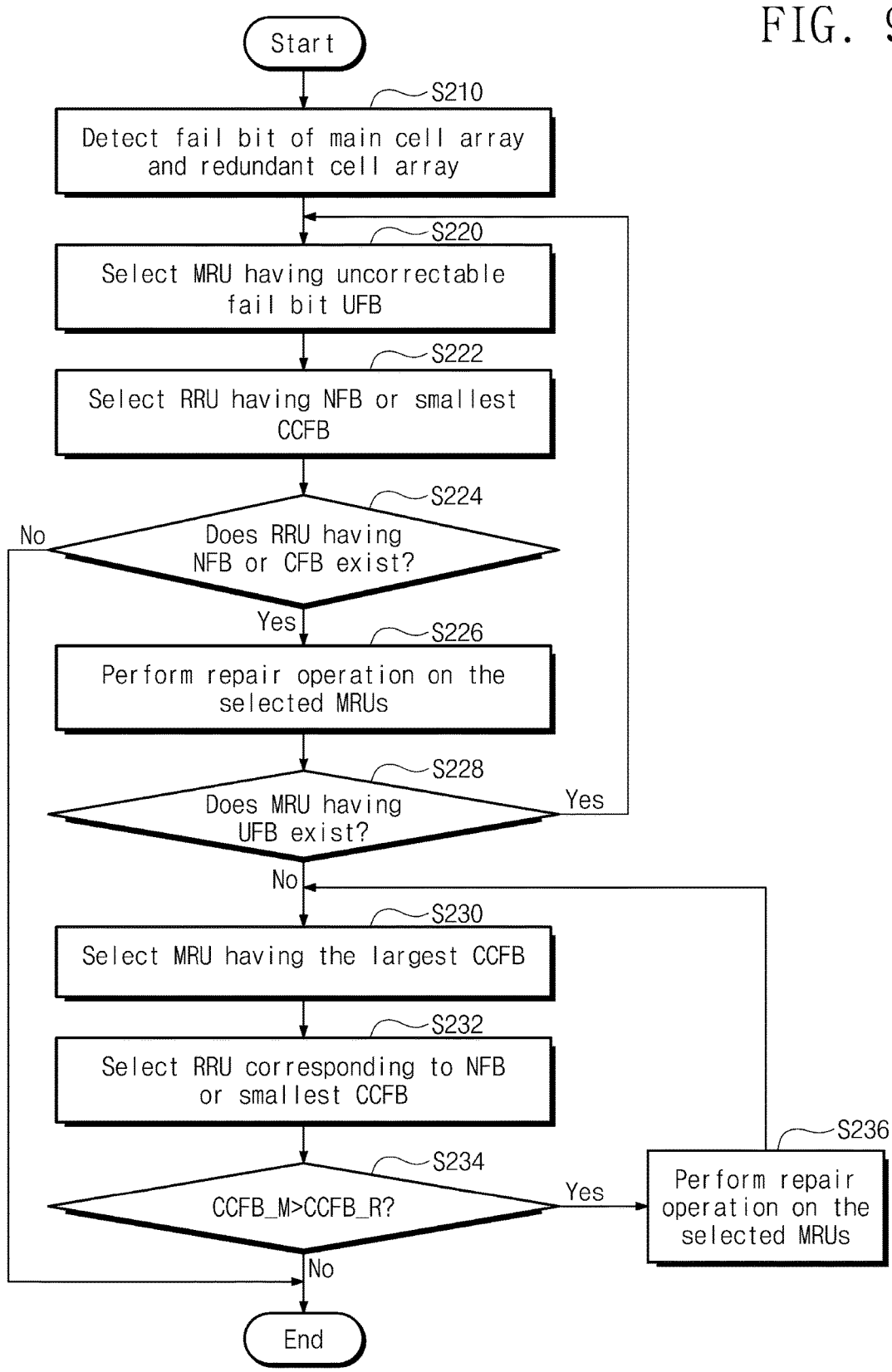
FIG. 9 is a flowchart illustrating a method of performing a repair operation with reference to cumulative correctable fail bit counts illustrated in FIG. 8, according to example embodiments.

FIG. 9 is a flowchart illustrating a method of performing a repair operation with reference to cumulative correctable fail bit counts illustrated in FIG. 8. A repair procedure using a cumulative correctable fail bit count CCFB in the case of including a plurality of redundant repair units RRUs will be described with reference to FIG. 9.

In operation S210, the DFT block 130 detects fail bits of the main cell array 110 and the redundant cell array 120. For example, the DFT block 130 may write error correction encoded data in the main cell array 110 and the redundant cell array 120, and may perform an error detection and decoding operation on read data to detect whether a fail bit exists and the number of fail bits. Alternatively, the DFT block 130 may detect the number of fail bits for each codeword unit in a way to write data in the main cell array 110 and the redundant cell array 120 and to compare read data with the written data.

In operation S220, the DFT block 130 checks the fail bit status of the main cell array 110. For example, the DFT block 130 may select any one main repair unit MRU including a fail bit error uncorrectable by the ECC logic 150 among main repair units MRUs.

In operation S222, the DFT block 130 selects a redundant repair unit RRU that may be used to replace the selected main repair unit MRU. In this case, the DFT block 130 may select any one of the redundant repair units RRUs, from which a fail bit is absent or which has the smallest cumulative correctable fail bit count CCFB.

In operation S224, the DFT block 130 may determine whether a redundant repair unit RRU having the non-fail bit NFB status or the correctable fail bit CFB status exists. In the case where a redundant repair unit RRU having the non-fail bit NFB status or the correctable fail bit CFB status does not exist (S224, No), the method ends. In contrast, in the case where a redundant repair unit RRU having the non-fail bit NFB status or the correctable fail bit CFB status exists (S224, Yes), the procedure proceeds to operation S226.

In operation S226, the main repair unit MRU selected in operation S220 is repaired with the redundant repair unit RRU selected in operation S222. For example, the selected main repair unit MRU may be replaced with the selected redundant repair unit RRU by performing a fuse program operation on the repair logic 140.

In operation S228, the DFT block 130 checks whether a main repair unit MRU having the uncorrectable fail bit UFB status is present in the main cell array 110. In the case where a main repair unit MRU having the uncorrectable fail bit UFB status is further present in the main cell array 110 (S228, Yes), the process proceeds to operation S220. In contrast, in the case where a main repair unit MRU having the uncorrectable fail bit UFB status is not further present in the main cell array 110 (S228, No), the process proceeds to operation S230.

In operation S230, the DFT block 130 may select any one main repair unit MRU having the greatest cumulative correctable fail bit count CCFB among the main repair units MRUs.

In operation S232, the DFT block 130 may select a redundant repair unit RRU having the non-fail bit NFB status among the redundant repair units RRUs. However, in the case where a redundant repair unit RRU having the non-fail bit NFB status does not exist any longer, a redundant repair unit RRU having the smallest cumulative correctable fail bit count CCFB may be selected.

In operation S234, the DFT block 130 compares a cumulative correctable fail bit count CCFB_M of the main repair unit MRU selected in operation S230 and a cumulative correctable fail bit count CCFB_R of the redundant repair unit RRU selected in operation S232. In the case where the cumulative correctable fail bit count CCFB_M of the main repair unit MRU is not greater than the cumulative correctable fail bit count CCFB_R of the redundant repair unit RRU (S234, No), the method ends. In the case where the cumulative correctable fail bit count CCFB_M of the selected main repair unit MRU is greater than the cumulative correctable fail bit count CCFB_R of the redundant repair unit RRU (S234, Yes), the procedure proceeds to operation S236.

In operation S236, the DFT block 130 repairs the main repair unit MRU selected in operation S230 with the redundant repair unit RRU selected in operation S232. Afterwards, the procedure proceeds to operation S230 to select a new main repair unit MRU.

The repair procedure in the case of a plurality of redundant repair units RRUs is described above. For example, a main repair unit MRU having an uncorrectable fail bit UFB status or the greatest cumulative correctable fail bit count CCFB is preferentially selected to perform a repair operation using an error correction code. In contrast, a redundant repair unit RRU having a non-fail bit NFB status or the small number of fail bits has a priority upon selecting a redundant repair unit RRU, and may be selected before other redundant repair units RRUs with larger numbers of fail bits.

Figure 10:
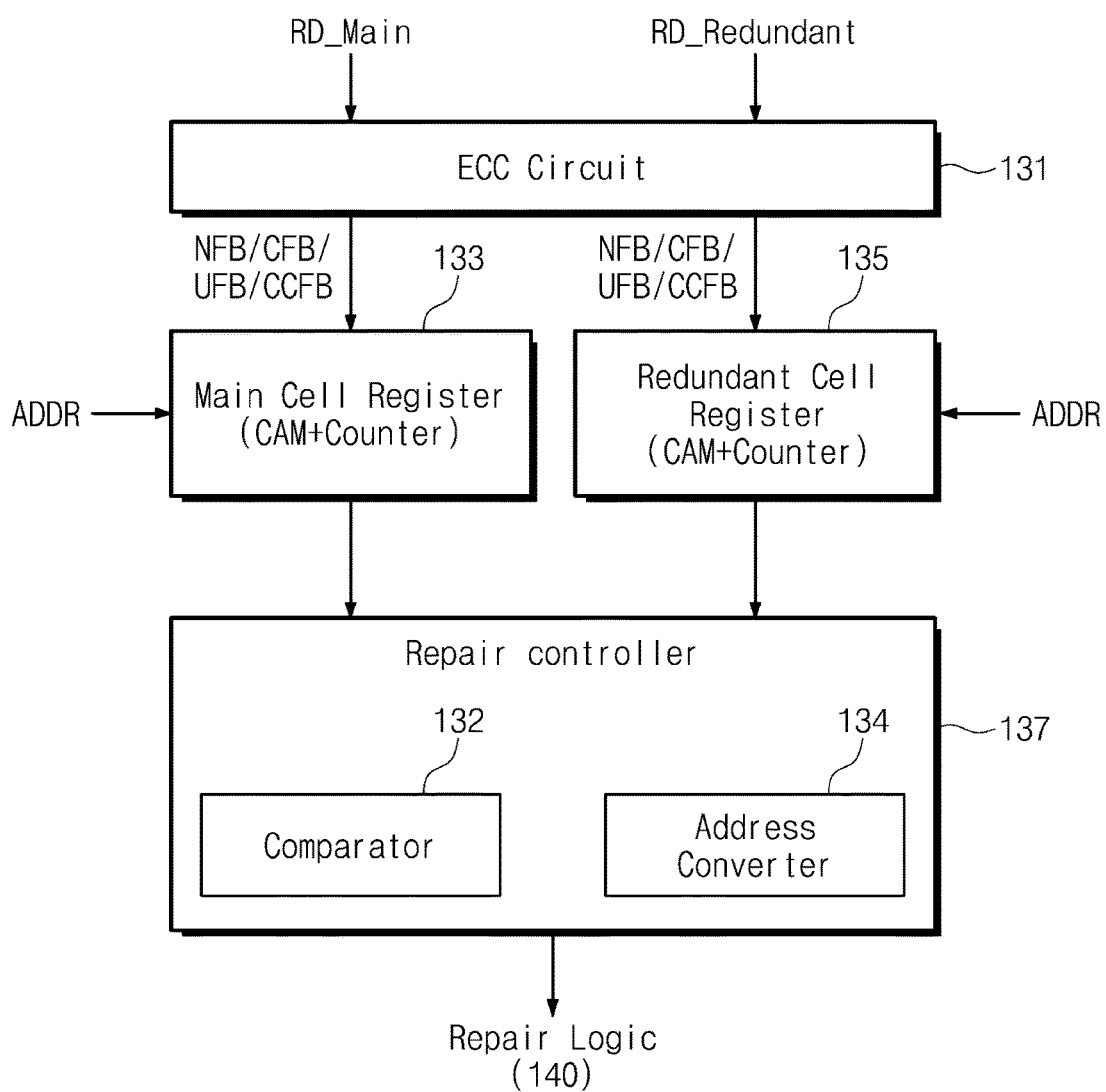
FIG. 10 is a block diagram illustrating an exemplary configuration of a testability block of FIG. 1, according to example embodiments.

FIG. 10 is a block diagram illustrating an exemplary configuration of a DFT block 130 of FIG. 1. Referring to FIG. 10, the DFT block 130 includes an ECC circuit 131, a main cell register 133, a redundant cell register 135, and a repair controller 137.

The ECC circuit 131 may detect a fail bit status CFB, UFB, or NFB, and a cumulative correctable fail bit count CCFB of each main repair unit RU from test data RD_Main read from the main cell array 110. The detected fail bit status CFB, UFB, or NFB, and the detected cumulative correctable fail bit count CCFB of each main repair unit RU are provided to the main cell register 133. In addition, the ECC circuit 131 may detect a fail bit status CFB, UFB, or NBF and a cumulative correctable fail bit count CCFB of each redundant repair unit from test data RD_Redundant read from the redundant cell array 120. The detected fail bit status CFB, UFB, or NBF and the detected cumulative correctable fail bit count CCFB of each redundant repair unit RU are provided to the redundant cell register 135.

The main cell register 133 stores a fail bit status CFB, UFB, or NBF and a cumulative correctable fail bit count CCFB of each main repair unit MRU received from the ECC circuit 131. The main cell register 133 may also store an address ADDR of a main repair unit MRU provided from an address decoder (not illustrated). For example, the main cell register 133 may include a contents addressable memory (CAM) that may store the address ADDR of the main repair unit MRU and a counter that may store and update a cumulative correctable fail bit count CCFB of an associated address.

The redundant cell register 135 stores a fail bit status CFB, UFB, or NBF and a cumulative correctable fail bit count CCFB of each redundant repair unit RRU received from the ECC circuit 131. The redundant cell register 135 may also store an address ADDR of a redundant repair unit RRU provided from the address decoder (not illustrated). For example, the redundant cell register 135 may include a contents addressable memory (CAM) that may store the address ADDR of the redundant repair unit RRU and a counter that may store and update a cumulative correctable fail bit count CCFB of an associated address.

The repair controller 137 may perform a repair operation by using data stored in the main cell register 133 and the redundant cell register 135. The repair controller 137 determines whether to perform a repair operation, based on a result of comparing a cumulative correctable fail bit count CCFB of each repair unit MRU stored in the main cell register 133 and a cumulative correctable fail bit count CCFB of each repair unit RRU stored in the redundant cell register 135. In the case where it is determined that there is a need to perform a repair operation, the repair controller 137 may convert an address stored in the CAM of the main cell register 133 to an address stored in the CAM of the redundant cell register 135 through mapping. To this end, the repair controller 137 may include a comparator 132 and an address converter 134. An address converted for repair may be used in a program operation of the repair logic 140.

Figure 11B:
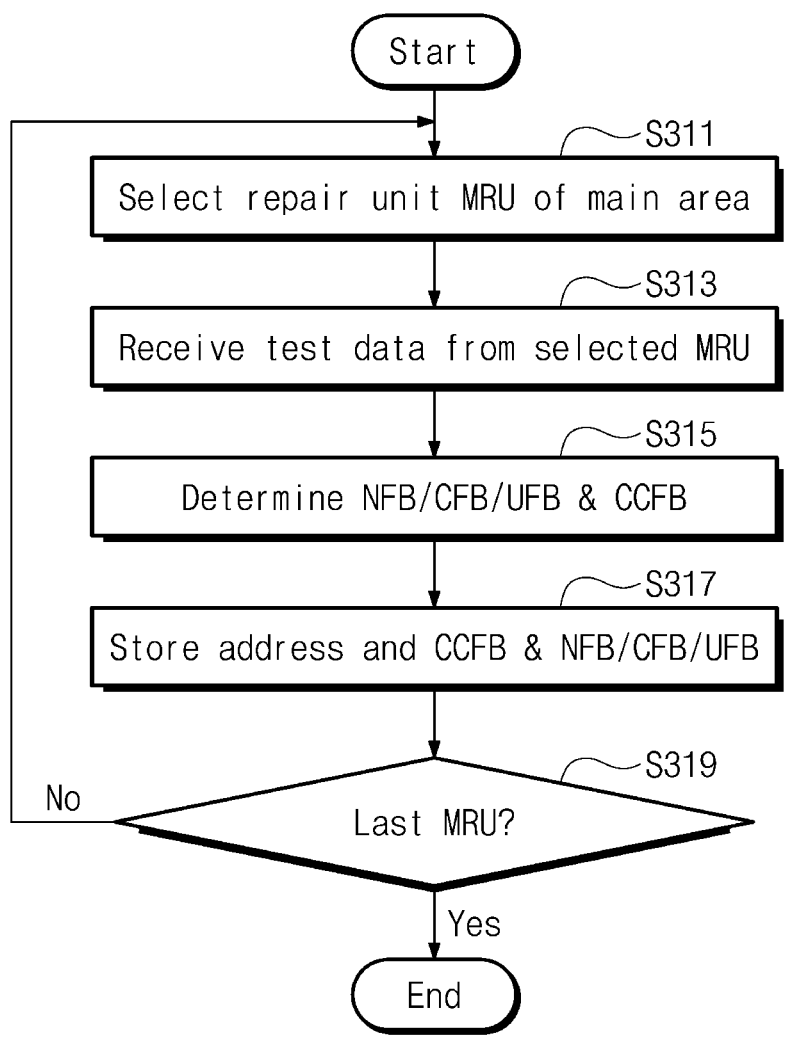

FIGS. 11A and 11B are views for describing a characteristic of a main cell register of FIG. 10. FIG. 11A is a table illustrating an exemplary configuration of a main cell register 133a. Referring to FIG. 11A, the main cell register 133a may include a register corresponding to a CAM storing addresses of main repair units MRUs, a register storing cumulative correctable fail bit counts CCFB, and a register storing fail bit status (CFB, UFB, NFB) of each main repair unit MRU. For example, the main cell register 133a corresponding to the main cell array 110 of FIG. 8 may be composed of 8 register sets.

An address ADDR of the main repair unit MRU<0> including an uncorrectable fail bit UFB error, a cumulative correctable fail bit count CCFB_M (=200) corresponding to the address ADDR, and the fail bit status may constitute one register set. Register sets associated with the remaining main repair units MRU<1> to MRU<7> may be configured to be the same as the register set associated with the main repair unit MRU<0>.

FIG. 11B is a flowchart illustrating an update method of the main cell register 133a of FIG. 11A. Referring to FIG. 11B, in the case where the number of register sets is sufficient, all information of main repair units MRUs may be stored in the main cell register 133a.

In operation S311, any one of the main repair units MRUs is selected. For example, the main repair units MRUs may be selected according to the order of addresses ADDR (e.g., lowest to highest, highest to lowest, etc.).

In operation S313, test data stored in the selected main repair unit MRU may be read. For example, a plurality of codewords stored in the main repair unit MRU may be read, and the read codewords may be provided to the ECC circuit 131. The ECC circuit 131 detects an error bit included in each of the plurality of codewords thus provided.

In operation S315, the ECC circuit 131 determines a fail bit status CFB/UFB/NFB of the selected main repair unit MRU with reference to the number of error bits detected from each codeword. In the case where an error bit is detected, the ECC circuit 131 may count the number of correctable error bits included in each codeword and may calculate a cumulative correctable fail bit count CCFB.

In operation S317, an address ADDR, a fail bit status CFB/UFB/NFB, and a cumulative correctable fail bit count CCFB of the selected main repair unit MRU may be stored in the corresponding register set to the selected repair unit.

In operation S319, whether a currently selected repair unit MRU is the last repair unit of the main repair units MRUs is determined. For example, the main cell array 110 is checked to determine whether a main repair unit MRU targeted for detection of the fail bit status CFB/UFB/NFB and the cumulative correctable fail bit count CCFB is present or not. In the case where the currently selected main repair unit MRU is the last repair unit of the main repair units (S319, Yes), the update operation of the main cell register 133*a* is terminated. In contrast, in the case where the currently selected main repair unit MRU is not the last repair unit of the main repair units (S319, No), the procedure proceeds to operation S131, in which a new main repair unit MRU may be selected.

Figures 12A, 12B:
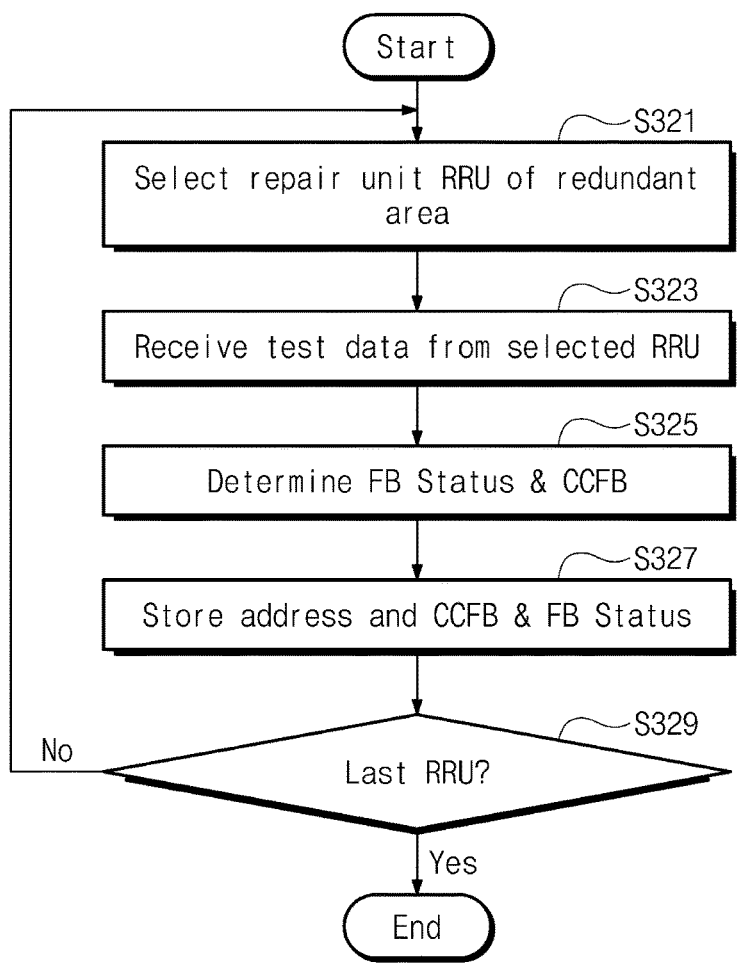
FIGS. 12A and 12B are views for describing a characteristic of a redundant cell register of FIG. 10, according to example embodiments.

FIGS. 12A and 12B are views for describing a characteristic of a redundant cell register of FIG. 10. FIG. 12A is a table illustrating an exemplary configuration of a redundant cell register 135*a*. Referring to FIG. 12A, the redundant cell register 135*a* may include a register corresponding to a CAM storing addresses of redundant repair units RRUs, a register storing cumulative correctable fail bit counts CCFB, and a register storing fail bit status (CFB, UFB, NFB) for each redundant repair unit RRU. For example, the redundant cell register 135*a* corresponding to the redundant cell array 120 of FIG. 8 may be composed of 4 register sets.

An address ADDR of the redundant repair unit RRU<2> including an uncorrectable fail bit UFB error, a cumulative correctable fail bit count CCFB_M (=150) corresponding to the address ADDR, and the fail bit status may constitute one register set. Register sets associated with the remaining redundant repair units RRU<0>, RRU<1>, and RRU<3> may be configured to be the same as the register set associated with the redundant repair unit RRU<2>.

FIG. 12B is a flowchart illustrating an update method of the redundant cell register 135*a* of FIG. 12A. Referring to FIG. 12B, in the case where the number of register sets is sufficient, all information of redundant repair units RRUs may be stored in the redundant cell register 135*a*.

In operation S321, any one of the redundant repair units RRUs is selected. For example, the redundant repair units RRUs may be selected according to the order of addresses ADDR (e.g., lowest to highest, highest to lowest, etc.).

In operation S323, test data stored in the selected redundant repair unit RRU may be read. For example, a plurality of codewords stored in the redundant repair unit RRU may be read, and the read codewords may be provided to the ECC circuit 131. The ECC circuit 131 detects an error bit included in each of the plurality of codewords thus provided.

In operation S325, the ECC circuit 131 determines a fail bit (FB) status CFB/UFB/NFB of the selected redundant repair unit RRU with reference to the number of error bits detected from each codeword. In the case where an error bit is detected, the ECC circuit 131 may count the number of correctable error bits included in each codeword and may calculate a cumulative correctable fail bit count CCFB.

In operation S327, an address ADDR, a fail bit (FB) status CFB/UFB/NFB, and a cumulative correctable fail bit count CCFB of the selected repair unit RRU may be stored in the corresponding register set of the redundant cell register 135*a*.

In operation S329, whether a currently selected repair unit RRU is the last repair unit of the redundant repair units RRUs is determined. For example, the redundant cell array 120 is checked to determine whether a redundant repair unit RRU targeted for detection of the fail bit status CFB/UFB/NFB and the cumulative correctable fail bit count CCFB is present or not. In the case where the currently selected redundant repair unit RRU is the last repair unit of the redundant repair units RRUs (S329, Yes), the update operation of the redundant cell register 135*a* is terminated. In contrast, in the case where the currently selected redundant repair unit RRU is not the last repair unit of the redundant repair units RRUs (S329, No), the procedure proceeds to operation S321, in which a new redundant repair unit RRU may be selected.

A method of setting register sets of the main cell register 133 and the redundant cell register 135 is briefly described with reference to FIGS. 11A, 11B, 12A, and 12B.

Figure 13B:
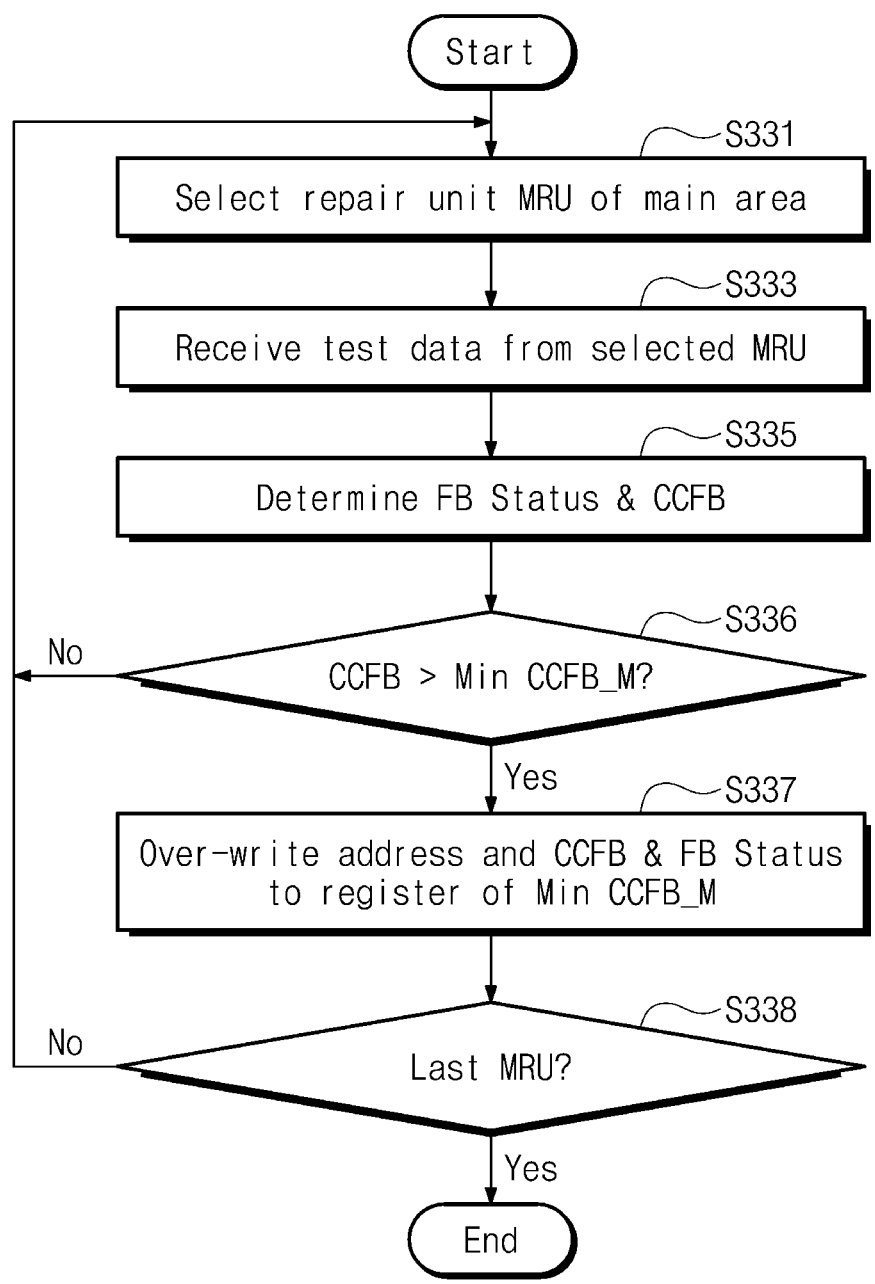

FIGS. 13A and 13B are views for describing another characteristic of a main cell register of FIG. 10. FIG. 13A is a table illustrating a configuration of a main cell register 133*b* according to another embodiment. Referring to FIG. 13A, the main cell register 133*b* may include a register corresponding to a CAM storing addresses of main repair units MRUs, a register storing cumulative correctable fail bit counts CCFB, and a register storing fail bit status (CFB, UFB, NFB) of each main repair unit MRU. However, FIG. 13A shows the case in which the number of register sets included in the main cell register 133*b* is insufficient compared with the number of main repair units MRUs.

For example, the number of main repair units MRUs illustrated in FIG. 8 is 8, but 4 register sets may be included in the main cell register 133*b*. In this case, a main repair unit MRU having an uncorrectable fail bit UFB status may be first of all stored in the main cell register 133*b*. A main repair unit MRU having the greatest cumulative correctable fail bit count CCFB_M may be stored in the main cell register 133*b* with a next priority.

In an embodiment, an address ADDR of the main repair unit MRU<0> having the uncorrectable fail bit UFB status, a cumulative correctable fail bit count CCFB_M (=200) corresponding to the address ADDR, and the fail bit status are stored in one register set. In the case of the remaining main repair units MRUs, cumulative correctable fail bit counts CCFB_M are stored in the main cell register 133*b* together with corresponding addresses in descending order from greatest to lowest values. For example, cumulative correctable fail bit counts CCFB_M may be stored in the main cell register 133*b* together with corresponding addresses in the following order: the main repair unit MRU<6> having a cumulative correctable fail bit count CCFB_M of "50", the main repair unit MRU<3> having a cumulative correctable fail bit count CCFB_M of "40", and the main repair unit MRU<1> having a cumulative correctable fail bit count CCFB_M of "30".

FIG. 13B is a flowchart illustrating an update method of the main cell register 133*b* of FIG. 13A. Referring to FIG. 13B, in the case where the number of register sets provided in the main cell register 133*b* is insufficient, priorities of repair units to be assigned to register sets of the main cell register 133*b* may be determined according to values of cumulative correctable fail bit counts CCFB_M.

In operation S331, any one of main repair units MRUs is selected. For example, the main repair units MRUs may be selected according to the order of addresses ADDR.

In operation S333, test data stored in the selected main repair unit MRU may be read. For example, a plurality of codewords stored in the main repair unit MRU may be read, and the read codewords may be provided to the ECC circuit 131. The ECC circuit 131 detects an error bit included in each of the plurality of codewords thus provided.

In operation S335, the ECC circuit 131 determines a fail bit (FB) status CFB/UFB/NFB of the selected main repair unit MRU with reference to the number of error bits detected from each codeword. In the case where an error bit is detected, the ECC circuit 131 may count the number of correctable error bits included in each codeword and may calculate a cumulative correctable fail bit count CCFB.

In operation S336, the repair controller 137 compares a cumulative correctable fail bit count CCFB_M of the selected main repair unit MRU and a minimum cumulative correctable fail bit count Min CCFB_M of cumulative correctable fail bit counts CCFB_M of main repair units MRUs currently stored in the main cell register 133b. In the case where the cumulative correctable fail bit count CCFB_M of the selected main repair unit MRU is not greater than the minimum cumulative correctable fail bit count Min CCFB_M (S336, No), the procedure proceeds to operation S331. In contrast, in the case where the cumulative correctable fail bit count CCFB_M of the selected main repair unit MRU is greater than the minimum cumulative correctable fail bit count Min CCFB_M (S336, Yes), the procedure proceeds to operation S337.

In operation S337, the repair controller 137 overwrites information of the main repair unit MRU selected in operation S331 in a register set of the main cell register 133b, which has the minimum cumulative correctable fail bit count Min CCFB_M. For example, an address ADDR, a cumulative correctable fail bit count CCFB_M, a fail bit (FB) status CFB/UFB/NFB of the selected main repair unit MRU are written in the register set having the minimum cumulative correctable fail bit count Min CCFB_M.

In operation S338, whether a currently selected main repair unit MRU is the last repair unit of the main repair units MRUs is determined. For example, the main cell array 110 is checked to determine whether a main repair unit MRU targeted for detection of the fail bit status CFB/UFB/NFB and the cumulative correctable fail bit count CCFB is present or not. In the case where the currently selected main repair unit MRU is the last repair unit of the main repair units MRUs (S338, Yes), the update operation of the main cell register 133b is terminated. In contrast, in the case where the currently selected main repair unit MRU is not the last repair unit of the main repair units MRUs (S338, No), the procedure proceeds to operation S331, in which a new main repair unit MRU may be selected.

Figures 14A, 14B:
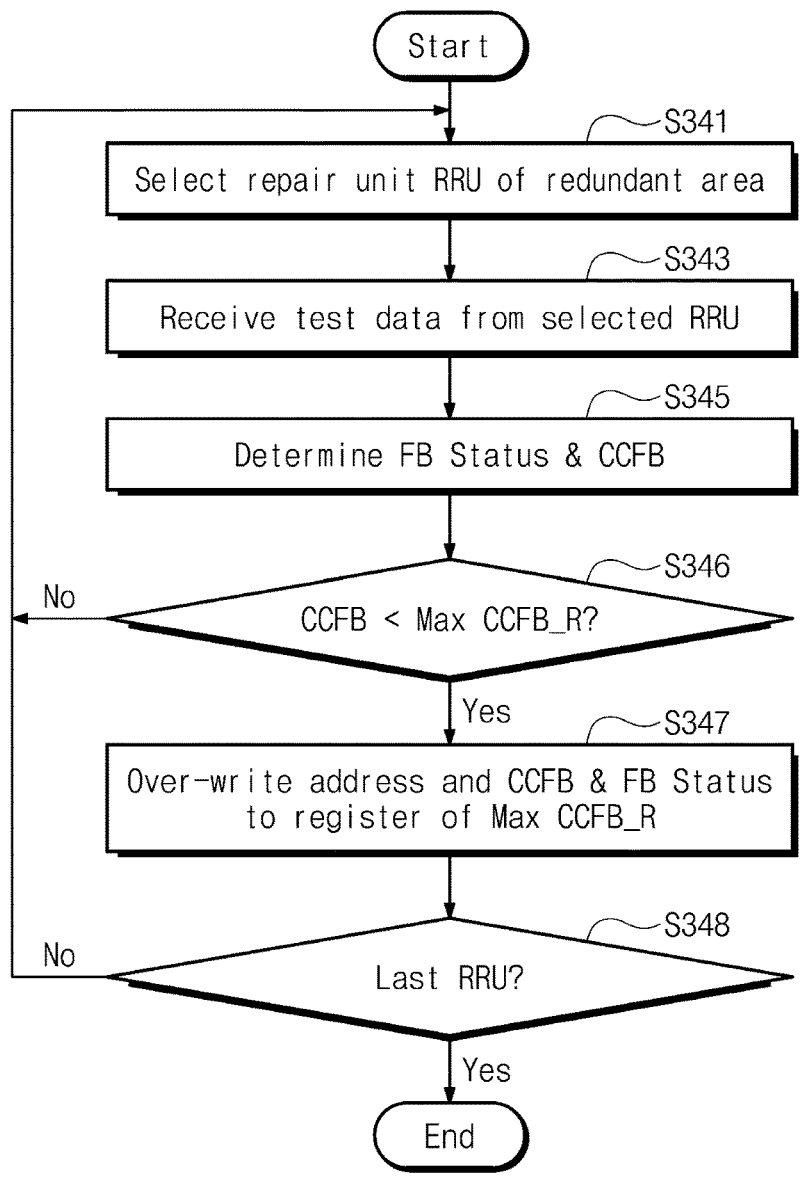
FIGS. 14A and 14B are views for describing another characteristic of a redundant cell register of FIG. 10, according to example embodiments.

FIGS. 14A and 14B are views for describing another characteristic of a redundant cell register of FIG. 10. FIG. 14A is a table illustrating a configuration of a redundant cell register 135b having a different characteristic from the redundant cell register 135a of FIG. 12A. Referring to FIG. 14A, the redundant cell register 135b may include a register corresponding to a CAM storing addresses of redundant repair units RRUs, a register storing cumulative correctable fail bit counts CCFB, and a register storing fail bit status (CFB, UFB, NFB) for each redundant repair unit RRU. The number of register sets of the redundant cell register 135b may be smaller than that of the redundant cell register 135a of FIG. 12A.

As the number of register sets is limited, information of redundant repair units RRUs to be stored in the redundant cell register 135b may also be limited. For example, four redundant repair units RRUs are present in the redundant cell array 120 of FIG. 8. However, only information of two redundant repair units RRUs of the four redundant repair units RRUs may be stored in the redundant cell register 135b. Under this condition, information of a redundant repair unit RRU having a non-fail bit NFB status is preferentially stored in the redundant cell register 135b. In the case where a redundant repair unit RRU having a non-fail bit NFB status does not exist, a redundant repair unit RRU having a relatively small cumulative correctable fail bit count CCFB_R may be stored in the redundant cell register 135b with the high priority.

According to the policy to set the redundant cell register 135b, information of the repair unit RRU<0> having the non-fail bit NFB status is first stored in the redundant cell register 135b. Next, information of the repair unit RRU<1>, which includes a fail bit but has the smallest cumulative correctable fail bit count CCFB_R (=20), may be stored in the redundant cell register 135b.

FIG. 14B is a flowchart illustrating an update method of the redundant cell register 135b of FIG. 14A. Referring to FIG. 14B, in the case where the number of register sets is insufficient, only information of redundant repair units RRUs having the high priority may be stored in the redundant cell register 135b.

In operation S341, any one of the redundant repair units RRUs is selected. For example, the redundant repair units RRUs may be selected according to the order of addresses ADDR.

In operation S343, test data stored in the selected redundant repair unit RRU may be read. For example, a plurality of codewords stored in the redundant repair unit RRU may be read, and the read codewords may be provided to the ECC circuit 131. The ECC circuit 131 detects an error bit included in each of the plurality of codewords thus provided.

In operation S345, the ECC circuit 131 determines a fail bit (FB) status CFB/UFB/NFB of the selected redundant repair unit RRU with reference to the number of error bits detected from each codeword In the case where an error bit is detected, the ECC circuit 131 may count the number of correctable error bits included in each codeword and may calculate a cumulative correctable fail bit count CCFB.

In operation S346, the repair controller 137 compares a cumulative correctable fail bit count CCFB_R of the selected redundant repair unit RRU and a maximum cumulative correctable fail bit count Max CCFB_R of cumulative correctable fail bit counts CCFB_R of redundant repair units RRUs currently stored in the redundant cell register 135b. In the case where the cumulative correctable fail bit count CCFB_R of the selected redundant repair unit RRU is not smaller than the maximum cumulative correctable fail bit count Max CCFB_R (No), the procedure proceeds to operation S341. In contrast, in the case where the cumulative correctable fail bit count CCFB_R of the selected redundant repair unit RRU is smaller than the maximum cumulative correctable fail bit count Max CCFB_R (Yes), the procedure proceeds to operation S347.

In operation S347, the repair controller 137 overwrites information of the redundant repair unit RRU selected in operation S341 in a register set of the redundant cell register 135b, which has the maximum cumulative correctable fail bit count Max CCFB_R. For example, the repair controller 137 writes an address ADDR, a cumulative correctable fail bit count CCFB_R, a fail bit (FB) status CFB/UFB/NFB of the selected redundant repair unit RRU in the register set having the maximum cumulative correctable fail bit count Max CCFB_R.

In operation S348, whether a currently selected redundant repair unit RRU is the last repair unit of the redundant repair units RRUs is determined. For example, whether a redundant repair unit RRU targeted for detection of the fail bit status CFB/UFB/NFB and the cumulative correctable fail bit count CCFB_R is absent from the redundant cell array 120 is checked. In the case where the currently selected redundant repair unit RRU is the last repair unit of the redundant repair units RRUs (S348, Yes), the update operation of the redundant cell register 135b is terminated. In contrast, in the case where the currently selected redundant repair unit RRU is not the last repair unit of the redundant repair units RRUs (S348, No), the procedure proceeds to operation S341, in which a new redundant repair unit RRU may be selected.

A method of performing a repair operation effectively when the number of register sets included in the main cell register 133 and the redundant cell register 135 is insufficient is briefly described with reference to FIGS. 13A, 13B, 14A, and 14B.

Figure 15:
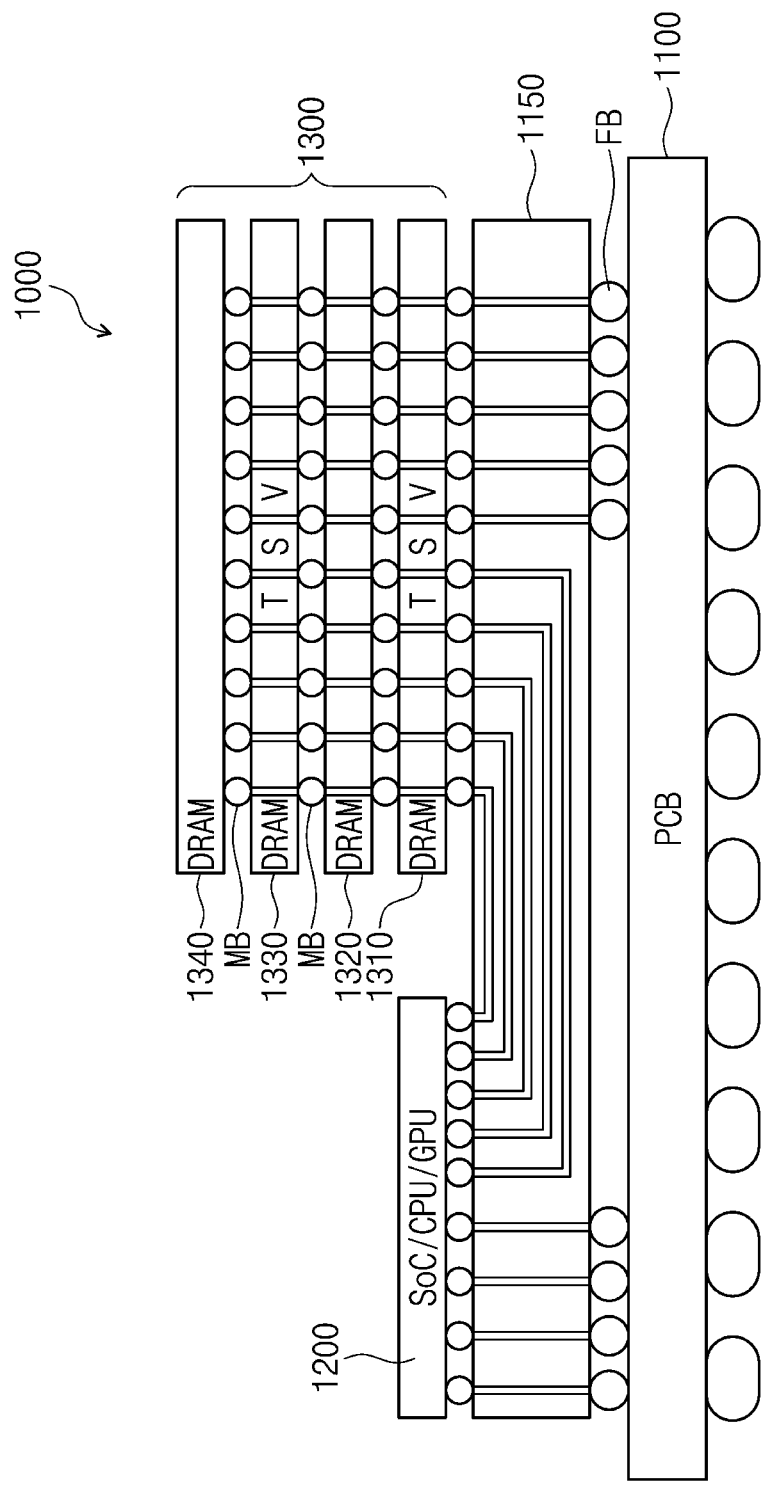
FIG. 15 is a block diagram illustrating a structure of a stacked memory chip including a semiconductor memory device, according to another example embodiment.

FIG. 15 is a block diagram illustrating a structure of a stacked memory chip including a DRAM, according to example embodiments. Referring to FIG. 15, a stacked memory chip 1000 may include a printed circuit board (PCB) 1100, a through silicon via (TSV) interposer layer 1150, a host die 1200, and a high bandwidth memory (HBM) 1300.

The stacked memory chip 1000 connects the HBM 1300 and the host die 1200 by using the TSV interposer layer 1150. The TSV interposer layer 1150 is disposed on the PCB 1100 and is electrically connected with the PCB 1100 through flip chip bumps FB.

The host die 1200, and DRAM dies 1310 to 1340 constituting the HBM 1300 are disposed on the TSV interposer layer 1150. To implement the structure of the HBM 1300, TSV lines are formed in the plurality of DRAM dies 1310 to 1340. The TSV lines of each of the DRAM dies 1310 to 1340 may be electrically connected to TSV lines to the other DRAM dies 1310 to 1340 with micro-bumps MB formed between each of the plurality of DRAM dies 1310 to 1340.

Here, each of the plurality of DRAM dies 1310 to 1340 may be implemented with the semiconductor memory device 100 of FIG. 1. For example, an error correction code based repair method may be applied to each of the plurality of DRAM dies 1310 to 1340 at a semiconductor manufacturing level.

Figure 16:
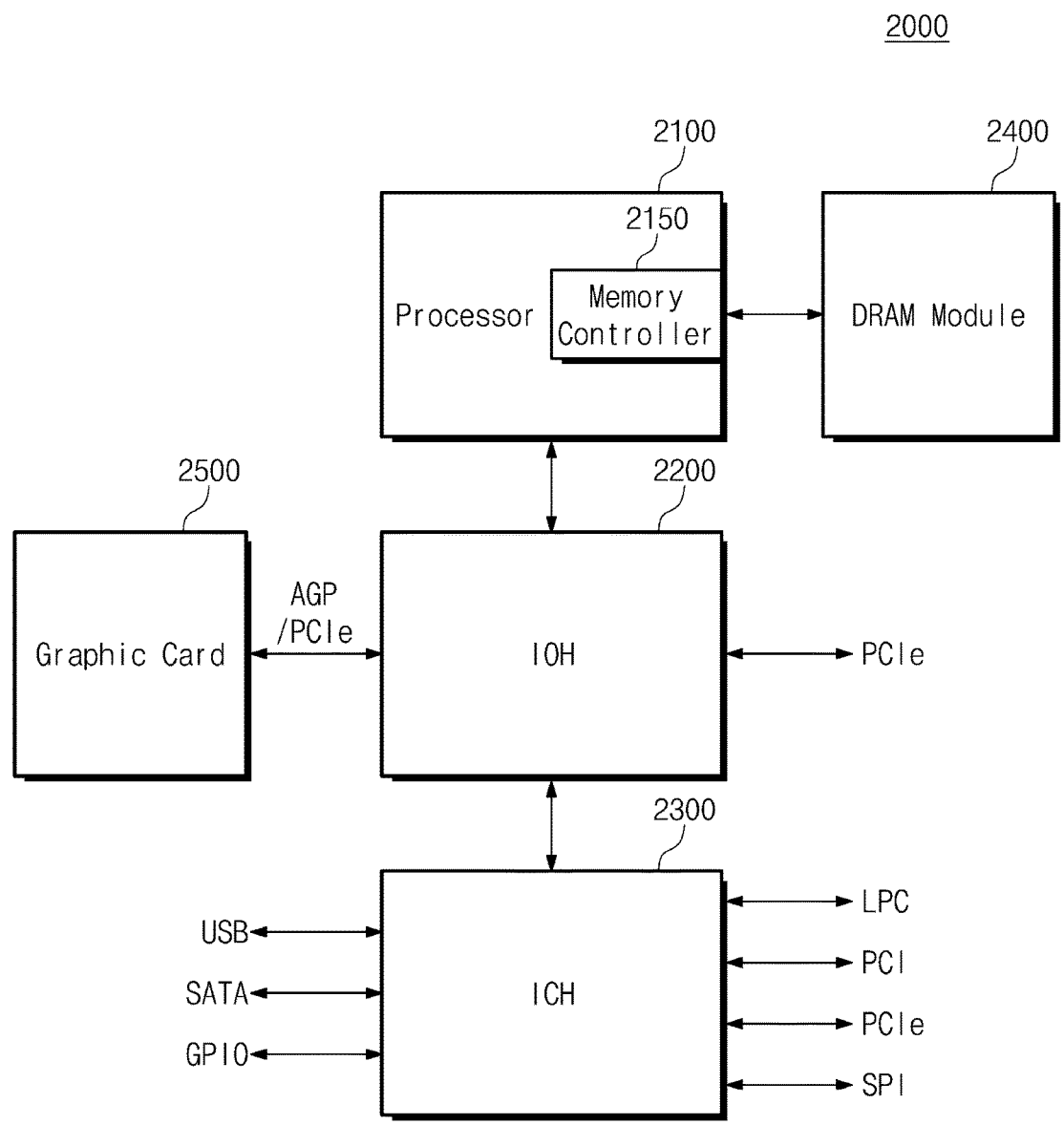
FIG. 16 is a block diagram illustrating a computing system including a semiconductor memory device, according to an example embodiment.

FIG. 16 is a block diagram illustrating a computing system including a semiconductor memory device, according to example embodiments. Referring to FIG. 16, a computing system 2000 includes a processor 2100, an input/output hub (IOH) 2200, an input/output controller hub (ICH) 2300, at least one DRAM module 2400, and a graphic card 2500.

The processor 2100 may execute various computing functions such as specific calculations or tasks. For example, the processor 2100 may be a microprocessor or a central processing unit (CPU). The processor 2100 may include a single processor core or may include a plurality of processor cores (or a multi-core). The processor 2100 may include a memory controller 2150 that controls an operation of the DRAM module 2400. The memory controller 2150 included in the processor 2100 is called an "integrated memory controller (IMC)". A memory interface between the memory controller 2150 and the DRAM module 2400 may be implemented with one channel including a plurality of signal lines or with a plurality of channels. Also, one or more DRAM modules may be connected with each channel. In some embodiments, the memory controller 2150 may be placed within the input/output hub 2200. The input/output hub 2200 including the memory controller 2150 may be called a "memory controller hub (MCH)".

The DRAM module 2400 may include a plurality of DRAM devices that store data provided from the memory controller 2150. Each of the DRAM devices may be implemented with the semiconductor memory device 100 of FIG. 1.

The input/output hub 2200 may manage data exchange between the processor 2100 and other devices, such as the graphic card 2500. The input/output hub 2200 may be connected to the processor 2100 through interfaces of various manners. The input/output hub 2200 may provide various interfaces with devices. For example, the input/output hub 2200 may provide an accelerated graphics port (AGP) interface, peripheral component interface-express (PCIe), a communications streaming architecture (CSA) interface, etc.

The graphic card 2500 may be connected with the input/output hub 2200 through AGP or PCIe. The graphic card 2500 may control a display device (not illustrated) for displaying an image. The graphic card 2500 may include an internal processor for processing image data and an internal semiconductor memory device.

The input/output controller hub 2300 may perform data buffering and interface arbitration to allow various system interfaces to operate effectively. The input/output controller hub 2300 may be connected with the input/output hub 2200 through an internal bus. For example, the input/output hub 2200 and the input/output controller hub 2300 may be connected through a direct media interface (DMI), a hub interface, an enterprise southbridge interface (ESI), PCIe, etc.

The input/output controller hub 2300 may provide various interfaces with peripheral devices. For example, the input/output controller hub 2300 may provide a universal serial bus (USB) port, a serial advanced technology attachment (SATA) port, a general purpose input/output (GPIO), a low pin count (LPC) bus, a serial peripheral interface (SPI), PCI, PCIe, etc.

According to example embodiments, it may be possible to improve the efficiency of repair in consideration of a defect that is correctable by using an error correction code in a semiconductor memory device including an on-chip error correction circuit. Accordingly, a semiconductor memory device may be manufactured with the yield that is not achieved only by using a redundancy repair scheme.

While the inventive concepts have been described with reference to exemplary embodiments thereof, it will be apparent to those of ordinary skill in the art that various changes and modifications may be made thereto without departing from the spirit and scope of the invention as set forth in the following claims.

What is claimed is:

1. A repair method of a semiconductor memory device which includes a memory cell array including a main cell array and a redundant cell array and error correction code (ECC) logic, the method comprising:
   detecting a fail bit of each of a main repair unit of the main cell array and a redundant repair unit of the redundant cell array;
   determining whether the fail bit detected from each of the main repair unit and the redundant repair unit is correctable to determine a first correctable status for the main repair unit or a second correctable status for the redundant repair unit, by using the ECC logic;
   calculating a first cumulative correctable fail bit count of the main repair unit and a second cumulative correctable fail bit count of the redundant repair unit; and
   determining whether to replace the main repair unit with the redundant repair unit depending on the first correctable status, the second correctable status, and the first and second cumulative correctable fail bit counts and performing a repair operation depending on a result of the determining.

2. The method of claim 1, further comprising:
when the first correctable status corresponds to an uncorrectable status and the second correctable status corresponds to a correctable status, replacing the main repair unit with the redundant repair unit.

3. The method of claim 1, further comprising:
when each of the first correctable status and the second correctable status corresponds to a correctable status and the first cumulative correctable fail bit count is greater than the second cumulative correctable fail bit count, replacing the main repair unit with the redundant repair unit.

4. The method of claim 1, further comprising:
when each of the first correctable status and the second correctable status corresponds to a correctable status and the first cumulative correctable fail bit count is not greater than the second cumulative correctable fail bit count, blocking replacement of the main repair unit with the redundant repair unit.

5. The method of claim 1, further comprising:
when the first correctable status corresponds to a non-fail bit status in which a fail bit does not exist and the second correctable status corresponds to an uncorrectable status, blocking replacement of the main repair unit with the redundant repair unit.

6. The method of claim 1, wherein the determining the first correctable status and the second correctable status further comprises:
determining the first correctable status to be an uncorrectable status when at least one of a plurality of main codeword units included in the main repair unit is uncorrectable; and
determining the second correctable status to be an uncorrectable status when at least one of a plurality of redundant codeword units included in the redundant repair unit is uncorrectable.

7. The method of claim 6, wherein the first cumulative correctable fail bit count is a value of summing fail bits of the plurality of main codeword units, and the second cumulative correctable fail bit count is a value of summing fail bits of the plurality of redundant codeword units.

8. A semiconductor memory device comprising:
a main cell array including a plurality of main repair units;
a redundant cell array including a plurality of redundant repair units;
error correction code logic configured to correct an error of data output from each of the main and redundant repair units; and
a testability block configured to detect a fail bit of each of the plurality of main and the plurality of redundant repair units and to replace at least one main repair unit, in which a defect is present, with at least one redundant repair unit with reference to a number of the detected fail bits and a correction capacity of the error correction code logic.

9. The semiconductor memory device of claim 8, wherein each of the plurality of main repair units or the plurality of redundant repair units includes at least one dynamic random access memory (DRAM) cell.

10. The semiconductor memory device of claim 8, wherein the testability block includes:
an error detection circuit configured to output first defect information by detecting the fail bit of the plurality of main repair units and to output second defect information by detecting the fail bit of the plurality of redundant repair units;
a main cell register configured to store a first address corresponding to the first defect information and the first defect information;
a redundant cell register configured to store a second address corresponding to the second defect information, and to store the second defect information; and
a repair controller configured to perform a repair operation based on a result of comparing the first defect information and the second defect information.

11. The semiconductor memory device of claim 10, wherein the first defect information includes a fail bit count or a fail bit status of each of the plurality of main repair units, and the second defect information includes a fail bit count or a fail bit status of each of the plurality of redundant repair units.

12. The semiconductor memory device of claim 11, wherein an information of a main repair unit having an uncorrectable fail bit error or a large fail bit count is stored in the main cell register with a high priority, and
wherein an information of a redundant unit, in which a fail bit does not exist or which has a small fail bit count, is stored in the redundant cell register with a high priority.

13. The semiconductor memory device of claim 12, wherein the repair controller is further configured to replace an address of a main repair unit, which is selected according to a priority stored in each of the main cell register and the redundant cell register, with an address of a redundant repair unit.

14. The semiconductor memory device of claim 12, wherein each of the main cell register and the redundant cell register includes a contents addressable memory (CAM).

15. The semiconductor memory device of claim 8, further comprising:
repair logic configured to repair the at least one main repair unit selected from the plurality of main repair units with the at least one redundant repair unit selected from the plurality of redundant repair units under control of the testability block.

16. A semiconductor memory device comprising:
a memory cell array including a plurality of main repair units and a plurality of redundant repair units;
error correction code logic configured to perform an error detection and correction operation on data stored in the memory cell array; and
a testability block configured to replace at least one main repair unit, in which a fail bit is present, with at least one redundant repair unit depending on a correction capability of the error correction code logic,
wherein a fail bit count of the at least one main repair unit is greater than a fail bit count of the at least one redundant repair unit, and a fail bit of the at least one redundant repair unit is correctable by the error detection and correction operation.

17. The semiconductor memory device of claim 16, wherein the at least one main repair unit is a main repair unit, which has an uncorrectable fail bit count, from among the plurality of main repair units.

18. The semiconductor memory device of claim 16, wherein at least one redundant repair unit of the plurality of redundant repair units does not include a fail bit.

19. The semiconductor memory device of claim 16, wherein the testability block includes a contents addressable memory (CAM) that stores the fail bit count and an address of the at least one main repair unit and the fail bit count and an address of the at least one redundant repair unit.

20. The semiconductor memory device of claim 16, wherein an information of a main repair unit having an uncorrectable fail bit error or a large fail bit count is stored in a main cell register of the memory cell array with a high priority, and wherein information of a redundant unit, in which a fail bit does not exist or which has a small fail bit count, is stored in a redundant cell register of the memory cell array with a high priority.

* * * * *